United States Patent
Hazelton

(10) Patent No.: US 6,870,600 B2
(45) Date of Patent: Mar. 22, 2005

(54) VIBRATION-ATTENUATION DEVICES AND METHODS USING PRESSURIZED BELLOWS EXHIBITING SUBSTANTIALLY ZERO LATERAL STIFFNESS

(75) Inventor: Andrew J. Hazelton, San Carlos, CA (US)

(73) Assignee: Nikon Corporation, Tokyo (JP)

(*) Notice: Subject to any disclaimer, the term of this patent is extended or adjusted under 35 U.S.C. 154(b) by 250 days.

(21) Appl. No.: 10/342,019

(22) Filed: Jan. 13, 2003

(65) Prior Publication Data

US 2004/0135979 A1 Jul. 15, 2004

(51) Int. Cl.⁷ .................. G03B 27/42; G03B 27/32; G03B 27/58; F16L 21/00
(52) U.S. Cl. ................ 355/53; 72/77; 285/226
(58) Field of Search .................. 355/53, 72, 73, 355/75, 76, 77; 285/226, 227; 138/121

(56) References Cited

U.S. PATENT DOCUMENTS

| | | | |
|---|---|---|---|
| 5,243,195 A | 9/1993 | Nishi | |
| 5,528,118 A | 6/1996 | Lee | |
| 5,623,853 A | 4/1997 | Novak et al. | |
| 5,668,672 A | 9/1997 | Oomura | |
| 5,689,377 A | 11/1997 | Takahashi | |
| 5,835,275 A | 11/1998 | Takahashi et al. | |
| 5,874,820 A | 2/1999 | Lee | |
| 5,892,177 A | 4/1999 | Mazaris | |
| 6,590,639 B1 * | 7/2003 | Yuan et al. | 355/75 |
| 6,614,508 B2 * | 9/2003 | Phillips et al. | 355/72 |
| 6,750,625 B2 * | 6/2004 | Binnard et al. | 318/592 |
| 2001/0040375 A1 * | 11/2001 | Aschoff et al. | 285/227 |
| 2003/0048428 A1 * | 3/2003 | Kemper et al. | 355/53 |

FOREIGN PATENT DOCUMENTS

WO    WO 01/81171    11/2001

OTHER PUBLICATIONS

U.S. Appl. No. 09/663,184, filed Sep. 15, 2000, Yuan et al.
Tsukimori et al., "The Buckling Behavior of U–Shaped Bellows under Pressure Loads", *Int. J. Pres. Ves. & Piping*, 44:365–380 (1990).

(List continued on next page.)

*Primary Examiner*—Alan Mathews
(74) *Attorney, Agent, or Firm*—Klarquist Sparkman, LLP

(57) ABSTRACT

Vibration-attenuation devices and methods are disclosed that utilize a bellows situated between a first and second mass and pressurized with a fluid to an internal fluid pressure substantially equal to a zero-stiffness pressure such that the bellows exhibits a substantially zero lateral stiffness. The devices may include various components configured to measure, regulate, and control the internal pressure of the bellows in order to maintain a desired pressure. The devices may include an active support, such as a secondary bellows or linear actuator, that provides a secondary support force. The active support may be connected to various components configured to measure and control the secondary support force. The vibration-attenuation devices disclosed may be used in a lithography exposure apparatus to attenuate vibrations between: (1) a support frame and a support surface; (2) a base and a stage-supporting platform; and (3) a supporting stage and a wafer stage.

111 Claims, 15 Drawing Sheets

OTHER PUBLICATIONS

Ting–Xin et al., "Natural Frequencies of U–Shaped Bellows", *Int. J. Pres. Ves. & Piping*, 42:61–74 (1990).

Paul Seide, "The Effect of Pressure on the Bending Characteristics of an Actuator System", *Journal of Applied Mechanics*, pp. 429–437 (Sep. 1960).

Hamada et al., "Design Diagrams and Formulae for U–Shaped Bellows", *Int. J. Pres. Ves. & Piping*, 4:315–328 (1976).

Laupa et al., "Analysis of U–Shaped Expansion Joints", *Journal of Applied Mechanics*, pp. 115–123 (Mar. 1962).

J.A. Haringx, "Instability of Thin–Walled Cylinders Subjected to Internal Pressure", *Philips Res. Rep.*, 7:112–118 (1952).

J.A. Haringx, "Instability of Bellows Subjected to Internal Pressure" *Philips Res. Rep.*, 7:189–196 (1952).

Hamada et al., "Strength of U–Shaped Bellows–Supplement: Design Formulas and Charts for the Case of Axial Loading", *Bull. Jap. Soc. Mech. Eng.*, 10:718–723 (Oct. 1967).

Hamada et al., "Strength of U–Shaped Bellows", *Bull. Jap. Soc. Mech. Eng.*, 8:525–531 (1965).

Hamada et al., "Strength of U–Shaped Bellows", *Bull. Jap. Soc. Mech. Eng.*, 10:611–617 (1967).

Hamada et al., "Bending Deformation of U–Shaped Bellows", *Bull. Jap. Soc. Mech. Eng.*, 14:401–409 (1971).

Hamada et al., "On Design Formulas of U–Shaped Bellows", *Journal of Pressure Vessel Technology*, 119:127–131 (Feb. 1997).

Product Bulletin for Nano–K™ isolators, Minus K Technology, Inglewood, CA 2000.

* cited by examiner

VIBRATION-ATTENUATION DEVICES AND METHODS USING PRESSURIZED BELLOWS EXHIBITING SUBSTANTIALLY ZERO LATERAL STIFFNESS

FIELD

This disclosure pertains generally to the attenuation of vibrations and other movements from one physical body to another.

BACKGROUND

Preventing the transmission of vibration and other movements from one body to another has been an important problem since the beginning of the machine age. The development of increasingly complex machines has resulted in the ubiquitous utilization in such machines of various approaches to vibration attenuation. Increases in the accuracy of tasks performed by various machines have demanded increasingly sophisticated and more tailored approaches to reducing the transmission of vibration. For several machine technologies, these approaches must not only account for internal vibrations that are transmitted from one portion of the machine to another, but also for external vibrations that may affect the work product of the machine.

An example of a machine technology in which demands on accuracy and precision are extreme is microlithography as used, for example, in the manufacture of microelectronic devices (e.g., integrated circuits). Microlithography involves the transfer of a pattern, used to define a layer of a microelectronic device, onto a sensitized surface of a suitable substrate such as a semiconductor wafer. Hence, microlithography is analogous to an extremely sophisticated photographic printing process. Modern microlithographic exposure apparatus (commonly called "steppers") are capable of imprinting patterns in which the pattern elements, as imaged on the substrate, have linewidths at or about the wavelength of the light used to form the image. For example, certain modern steppers can form images of linear pattern elements having a linewidth of 0.25 or 0.18 $\mu$m, or even smaller, on the substrate. Achieving such a high level of performance requires that all imaging, positioning, and measuring systems of the stepper operate at their absolute limits of performance. This level of performance also requires that vibrations and other unwanted physical displacements be eliminated from the machine.

A conventional approach to vibration attenuation between two physical bodies involves the use of one or more air springs between the bodies. An air spring is a spring device in which the energy-storage element is air that is confined in a container that usually includes an elastomeric bellows or diaphragm. Air springs are commercially available in many different configurations and sizes and are used in a wide variety of applications with good success. A key attribute of an air spring is its reduced axial stiffness with respect to the load applied to the air spring. (Usually the load is applied axially relative to the air spring.) For many applications, especially in situations in which attenuation of axial motion is the objective, an air spring is sufficient for achieving satisfactory vibration attenuation.

A disadvantage of an air spring for certain applications is its relatively high lateral stiffness. The high lateral stiffness can result in significant transmission via the air spring of non-axial motions from one body to another. If the subject machine is one in which and/or from which substantially all vibrations must be isolated completely, an air spring will exhibit unsatisfactory performance. For example, in a stepper machine, any significant lateral stiffness in a vibration-attenuation device can cause problems with overlay accuracy of different layers as imaged on a wafer. Another possible problem in a stepper machine is an increased synchronization error between the reticle stage and the wafer stage.

Hence, in modern stepper machines and other types of vibration-sensitive equipment, there is a need for vibration attenuators that exhibit good vibration attenuation in the axial direction and that exhibit low or substantially zero lateral stiffness to prevent transmission of any vibrations between any of various portions of the machine.

SUMMARY

In view of the shortcomings of the conventional vibration-attenuation devices summarized above, the present disclosure provides, among other things, devices and methods for attenuating axial and lateral vibrations and other movements between two physical masses. In general, the vibration-attenuation devices disclosed include a bellows defining an interior volume configured to be pressurized with a fluid, the interior volume of the bellows being pressurized to an internal fluid pressure "substantially equal to a zero-stiffness pressure" such that the bellows exhibits a "substantially zero lateral stiffness." As used in this context, "zero-stiffness pressure" refers to the internal pressure of a bellows at which the lateral stiffness of the bellows equals zero. Thus, a bellows pressurized to a pressure "substantially equal to a zero-stiffness pressure" such that the bellows exhibits a "substantially zero lateral stiffness" refers to a bellows having a pressure sufficiently close or equal to the zero-stiffness pressure such that the lateral behavior of the bellows is dominated by its low, or zero, lateral stiffness. The vibration-attenuation devices disclosed may be utilized in various types of machines requiring high-accuracy performance, such as lithographic exposure apparatus.

According to a first aspect, a vibration-attenuation device comprising a bellows situated along a respective support axis between a first and second mass is provided. The bellows defines an internal volume that is pressurized by a fluid to an internal fluid pressure substantially equal to a zero-stiffness pressure such that the bellows exhibits a substantially zero lateral stiffness.

According to a second aspect, a fluid source configured to supply the internal fluid pressure to the bellows of the first aspect may be connected to the internal volume of the bellows. A pressure sensor, a pressure regulator, and/or a controller may also be connected to the interior volume of the bellows. The pressure sensor may be configured to produce pressure data corresponding to the internal pressure of the bellows. The pressure regulator may be configured to adjust the internal pressure in response to the pressure data. The controller may control the fluid source and/or the pressure regulator in response to the pressure data or in order to establish a desired internal fluid pressure.

According to a third aspect, the mass supported by the vibration-attenuation device of the second aspect has a variable center of gravity. The device further includes a center-of-gravity sensor connected to the controller and configured to detect changes in the center of gravity in the second mass. The controller may change the internal fluid pressure in the bellows in response to the detected changes.

According to a fourth aspect, the vibration-attenuation device of the first aspect further includes at least one active support situated on a respective secondary support axis.

Thus, the bellows provides a primary support force, and the active support provides a secondary support force. Each bellows used in the vibration-attenuation device may have a respective active support associated with it.

According to a fifth aspect, the active support of the fourth aspect is configured to measure the secondary support force it applies. A controller may then be connected to the active support and configured to change the secondary support force, in response to the measured secondary support force, to a predetermined value. For instance, the controller may be configured to control the secondary support force to maintain the internal fluid pressure of the bellows at the pressure less then the zero-stiffness pressure such that the bellows maintains a substantially zero lateral stiffness.

According to a sixth aspect, the second mass supported by the vibration-attenuation device of the fifth aspect has a variable center-of-gravity. The device further includes a center-of-gravity sensor connected to the controller and configured to detect changes in the center of gravity in the second mass. The controller then changes the secondary support force applied by the active support in response to the detected changes. The controller may also be configured to change the secondary support force of the active support so as to maintain the second mass in a desired plane.

According to a seventh aspect, the active support of the fourth, fifth or sixth aspects comprises an air mount. The air mount may be, for instance, a secondary bellows having an interior volume less than the interior volume of the primary bellows.

An eighth aspect pertains to using any of the vibration-attenuation devices discussed above to attenuate vibrations or movements between a support surface and a support frame for supporting a lithographic exposure apparatus.

A ninth aspect pertains to using any of the vibration-attenuation devices discussed above to attenuate vibrations or movements between a base and a platform supporting a movable stage in a lithography system. The vibration-attenuation devices may include active supports that are further configured to move the platform in at least one degree of freedom relative to the base.

A tenth aspect pertains to using any of the vibration-attenuation devices discussed above to attenuate vibrations or movements between a supporting stage and a wafer stage in a lithography system. The vibration-attenuation devices may include active supports that are further configured to move the wafer stage in at least one degree of freedom relative to the supporting stage.

An eleventh aspect pertains to micro-devices manufactured in lithography systems using any of the vibration-attenuation devices summarized above.

The foregoing and additional features and advantages of the invention will be more readily apparent from the following detailed description, which proceeds with reference to the accompanying drawings.

DETAILED DESCRIPTION

Figure 1:
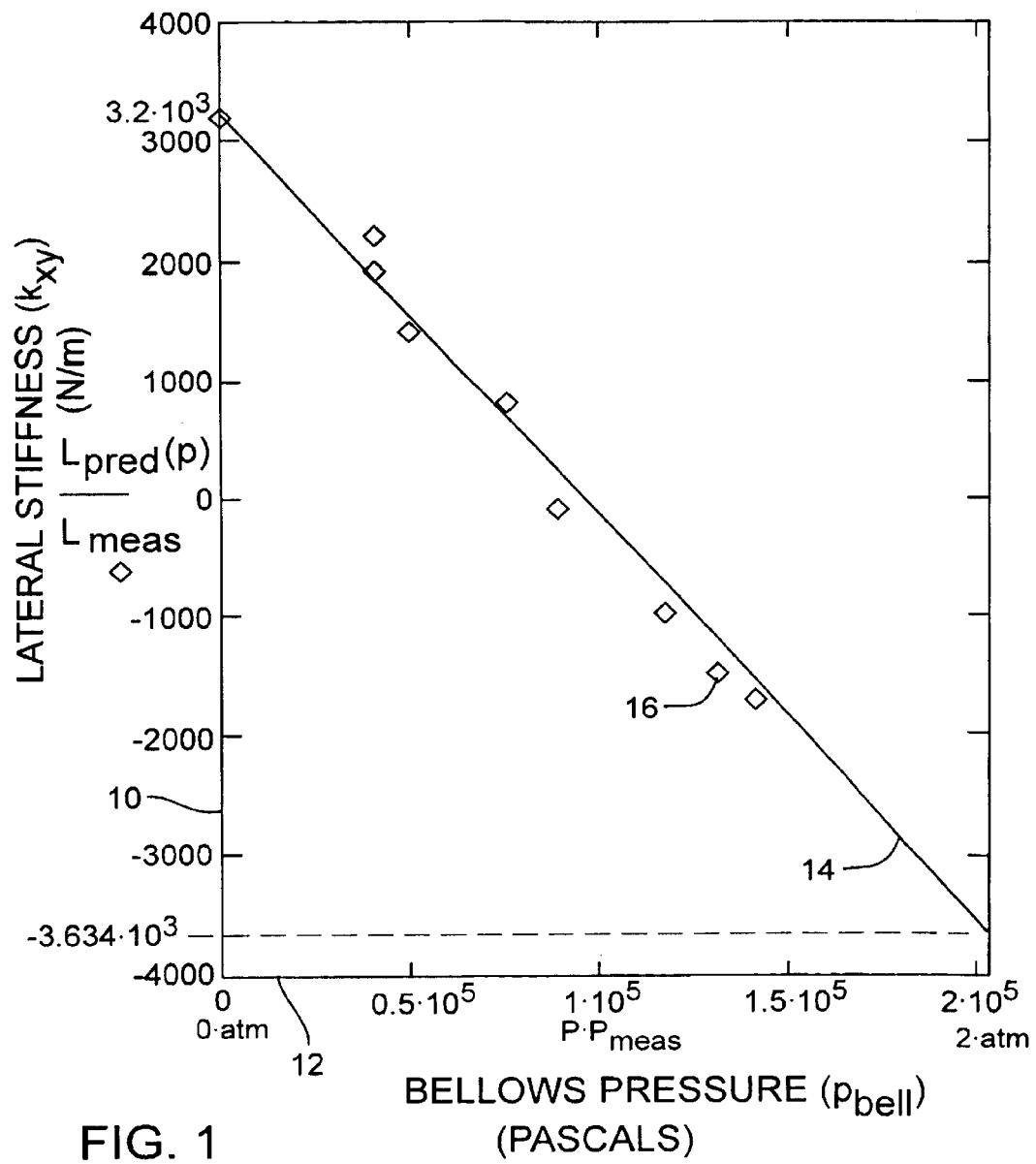
FIG. 1 is a graph showing the relationship between lateral stiffness and internal pressure of an exemplary bellows.

The disclosed devices and methods are described below in connection with representative embodiments that are not intended to be limiting in any way.

As used herein, "vibration attenuation" encompasses attenuation not only of "vibration" as this term is generally understood in the art (i.e., a continuing periodic change in displacement of a mass relative to a reference), but also attenuation of any of various types of movement of one mass relative to another mass. In other words, the attenuated movement is not limited to reduced continuing periodic motion.

For ease of explanation and depiction, the "support axis" extends in a Z direction between two masses and serves as a reference axis for any of the various embodiments described herein. Mutually perpendicular directions that are perpendicular to the Z direction are X and Y directions. The X and Y directions define a plane, termed the "XY plane" to which the support axis is perpendicular.

As used herein, "lateral" generally means sideways relative to the support axis. "Lateral" motion or "lateral" orientation in this regard includes motion and orientation, respectively, in a direction perpendicular to the support axis, and also includes motion and orientation, respectively, in a direction nearly perpendicular to the support axis, taking into account any existing or applied tilt relative to the support axis, as described below.

General Considerations

Although much literature has been devoted to studying the behavior of bellows subjected to axial loads, the behavior of bellows subjected to lateral loads has not been well reported or understood. For instance, it is known that a bellows subjected to an increasing internal pressure will eventually buckle, in much the way a beam subjected to an increasing axial load buckles. Thus, the internal pressure in the bellows can be equated with an axial load on a beam. In fact, the pressure at which buckling occurs in a bellows can be calculated using Euler's well-known equation for calculating buckling loads for beams.

When a bellows is subjected to complex loading conditions, however, its behavior is somewhat different than previously known or reported in the literature. In particular, the lateral stiffness of a bellows now has been found to decrease as the internal pressure of the bellows increases. This relationship may be derived using well-known beam equations applied to the context of a pressurized bellows.

First, the characteristics of an elastic beam subjected to only a lateral force can be equated with a bellows having no internal pressure subjected only to a lateral force. Specifically, the equation for calculating the maximum lateral deflection (y) resulting from a lateral load applied to the end of an elastic beam with a fixed end and a guided end is:

$$y = \frac{WL^3}{12EI} \quad (1)$$

where W is the lateral load on the beam, L is the length of the beam, E is the Young's modulus for the beam, and I is the moment of inertia for the beam.

Equation (1) can be rewritten to apply to an equivalent unpressurized bellows and to calculate the lateral stiffness of the unpressurized bellows, which is equal to the lateral load (W) divided by the lateral deflection (y):

$$k_{xy0} = \frac{W}{y} = \frac{12(EI_{equiv})}{L_b^3} \quad (2)$$

where $k_{xy0}$ is the lateral stiffness of the bellows at zero internal pressure, W is the lateral load applied at the end of the bellows, y is the lateral deflection at the end of the bellows, $L_b$ is the length of the bellows, and $EI_{equiv}$ is the bellows equivalent of the product of the Young's modulus and moment of inertia.

From this equation, the $EI_{equiv}$ of the bellows can be calculated. Specifically, $$EI_{equiv} = \frac{k_{xy0} L_b^3}{12} \quad (3)$$

Typically, the lateral stiffness of the bellows at zero internal pressure ($k_{xy0}$) and the length of the bellows ($L_b$) are known, thereby simplifying the calculation of $EI_{equiv}$. If the lateral stiffness is unknown, the bellow's manufacturer is often able to provide the value. Alternatively, the value can be measured in a suitable laboratory by one of ordinary skill in the art.

Once the value of the $EI_{equiv}$ of the bellows is known, the value can be used to calculate other behaviors of the bellows. Specifically, the equation for calculating the maximum lateral deflection for an elastic beam with a fixed end and a guided end subjected to both a lateral load and an axial load can be applied to predict the behavior of a pressurized bellows subjected to similar complex loads. After a minor manipulation substantially identical to the one performed above, the relevant equation is:

$$k_{xy} = \frac{W}{y} = \frac{CF}{2\tan\left(\frac{CL_b}{2}\right) - CL_b} \quad (4)$$

where $$C = \sqrt{\frac{F}{EI_{equiv}}} \quad (5)$$

and where $k_{xy}$ is the lateral stiffness of the bellows subjected to an axial force and F is the bellows equivalent of the axial force.

The bellows equivalent to the axial force (F) is a function of the internal pressure of the bellows according to the following relationship:

$$F = p_{bell} A_{bell} \quad (6)$$

where $p_{bell}$ is the internal pressure of the bellows and $A_{bell}$ is the area of the bellows. After substituting for F and for $EI_{equiv}$, the equation for lateral stiffness of the bellows ($k_{xy}$) can be rewritten as a function of pressure ($p_{bell}$):

$$k_{xy} = \frac{C p_{bell} A_{bell}}{2\tan\left(\frac{CL_b}{2}\right) - CL_b} \quad (7)$$

where $$C = \sqrt{\frac{p_{bell} A_{bell}}{EI_{equiv}}} \quad (8)$$

FIG. 1 is a graph showing this relationship for an exemplary bellows, which is not intended to be limiting in any way. The vertical axis 10 represents the lateral stiffness of the bellows ($k_{xy}$) in units of N/m. The horizontal axis 12 represents the internal pressure of the bellows ($p_{bell}$) in units of pascals. The solid line 14 in FIG. 1 shows the lateral stiffness as predicted by Equation (7). The diamonds 16 in FIG. 1 show actual $k_{xy}$ values measured for the exemplary bellows during a laboratory test. As can be seen in FIG. 1, the measured data agreed closely with the predicted results.

As is also apparent from FIG. 1, the lateral stiffness of the bellows decreased as the internal pressure of the bellows increased. At some pressure (about 100,000 pascals in FIG. 1), the lateral stiffness of the bellows became zero. Further increases in pressure resulted in the bellows exhibiting a negative lateral stiffness. As exemplified by the following representative embodiments, this property of a pressurized bellows can be applied in vibration-attenuation systems to provide a means for attenuating lateral vibrations.

First Representative Embodiment

Figure 2:
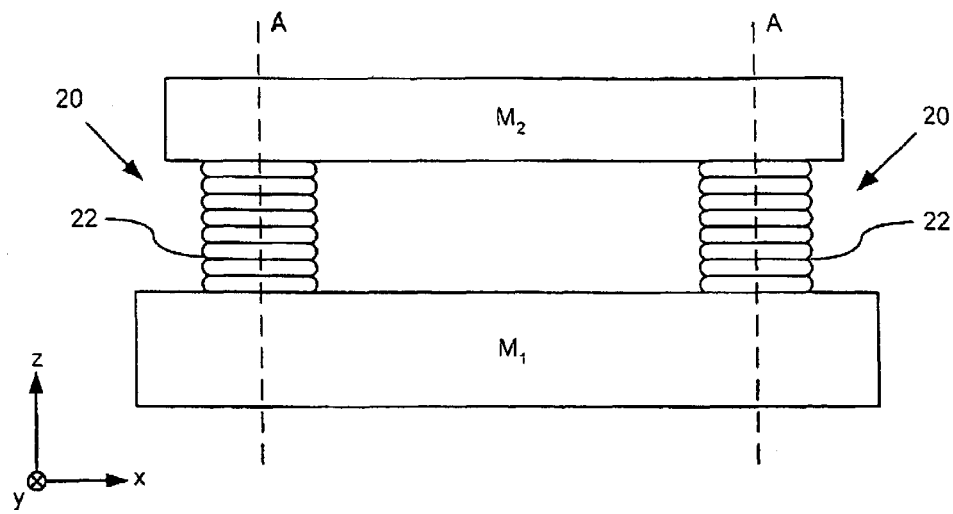
FIG. 2 schematically shows a vibration-attenuation device according to the first representative embodiment.

A vibration-attenuation device according to this embodiment is schematically shown in FIG. 2. Two vibration-attenuation devices 20 are situated between and contact a first mass ($M_1$) and a second mass ($M_2$). It is understood that, although multiple vibration-attenuation devices 20 are shown in FIG. 2 and in the figures showing the other embodiments disclosed herein, this number is not limiting. Instead, any number of vibration-attenuation devices 20 can be used to achieve the benefits of the disclosed technology.

By way of example, the masses $M_1$ and $M_2$ can be respective portions of a machine between which it is desired to attenuate vibration. Alternatively, one mass can be a floor of a building or other support surface and the other mass can be a machine or portion of a machine. In FIG. 2, the second mass $M_2$ can be regarded as the mass that is "isolated" from the first mass $M_1$ by the vibration-attenuation device 20.

Each vibration-attenuation device 20 comprises a bellows 22 that is configured to be pressurized internally with a fluid (liquid or gas). The bellows 22 of this embodiment (and the bellows of all embodiments described herein) may be manufactured using a number of different materials (e.g., electrodeposited nickel, stainless steel, rubber, etc.) and can have any of various thicknesses depending on the application for which the bellows is used. Further, the bellows 22 can have corrugations of various forms (e.g., rectangular).

The bellows 22 in FIG. 2 is aligned along a support axis A extending parallel to a Z direction such that the bellows partially supports mass $M_2$. In this embodiment and in any of the other embodiments of vibration-attenuation devices described below, the support axis need not be on the respective axes of the masses $M_1$ and $M_2$, and the respective axes of the masses $M_1$ and $M_2$ need not be aligned with each other. Also, the support axis need not be aligned with the direction of acceleration due to gravity. Moreover, the vibration-attenuation devices of this embodiment and all embodiments discussed herein may provide partial or complete support to mass $M_2$ or its equivalent.

In this embodiment, the interior of the bellows 22 is pressurized with a fluid (liquid or gas), such as air, to a pressure at which the bellows exhibits substantially zero lateral stiffness. As was discussed with respect to FIG. 1, the lateral stiffness of a bellows decreases as the internal pressure of the bellow increases and equals zero at some measurable pressure. This pressure is termed the "zero-stiffness pressure" and is equivalent to the buckling pressure of a fixed-end bellows having twice the length of the bellows 22 (i.e., the buckling pressure of a fixed-end bellows having a length $2L_b$).

If the pressure inside the bellows 22 is greater than the zero-stiffness pressure, then the bellows will exhibit a negative lateral stiffness. A bellows exhibiting negative lateral stiffness may become unstable and deform (i.e., "buckle") under a mass it is supporting. In certain applications, however, it may be desirable for the bellows 22 to have a pressure slightly greater than, but nevertheless within the scope of "substantially equal to," the zero-stiffness pressure. For instance, whenever multiple bellows or vibration-attenuation devices are used to support a mass $M_2$, it may be desirable to pressurize one or more of the bellows to a pressure greater than, but nevertheless "substantially equal to," the zero-stiffness pressure in order to optimize the interaction of the bellows 22 with the other bellows and/or devices. In some situations of this nature, the pressure inside the bellows 22 may exceed the zero-stiffness pressure by 20% or more.

If the pressure inside the bellows 22 is equal to the zero-stiffness pressure, then the bellows will exhibit zero lateral stiffness. A bellows exhibiting zero lateral stiffness will not return to its original lateral position after being displaced by an external lateral force, but will remain in its displaced position until acted upon by another lateral force. Although the bellows 22 will completely isolate the second mass $M_2$ from lateral vibrations present in the first mass $M_1$ at this pressure, the bellows may collapse if the lateral displacement exceeds a certain range. In certain applications, however, it may be desirable for the bellows 22 to have a pressure equal to the zero-stiffness pressure. For instance, the mass $M_2$ may have a separate mechanism for maintaining its position with respect to the mass $M_1$ (e.g., an electromagnetic actuator), thereby allowing the bellows 22 to exhibit zero lateral stiffness.

If the pressure inside the bellows 22 is less than the zero-stiffness pressure, then the bellows will exhibit a positive lateral stiffness. A bellows exhibiting a positive lateral stiffness will have a tendency to return to its original position after being acted upon by a lateral force. In certain applications, it may be desirable to pressurize the bellows 22 to a pressure less than, but nevertheless within the scope of, "substantially equal to" the zero-stiffness pressure. For instance, if the bellows 22 is the sole support and vibration-attenuation device between mass $M_1$ and mass $M_2$, it may be desirable to pressurize the bellows to a pressure less than, but nevertheless "substantially equal to," the zero-stiffness pressure so that the supported mass $M_2$ tends to return to its original position after a lateral displacement relative to the mass $M_1$. In some situations of this nature, the pressure inside the bellows 22 may be less than the zero-stiffness pressure by as much as 20% or more.

When internally pressurized to a pressure substantially equal to the zero-stiffness pressure, the bellows 22 of FIG. 2 exhibits substantially zero lateral stiffness and allows the mass $M_1$ to move with low coupling over a limited range in X and Y directions relative to the mass $M_2$. This low-coupling lateral movement eliminates substantially all lateral vibrations between the masses $M_1$ and $M_2$.

The precise amount of pressure in the bellows depends on the application involved, the masses supported, and the vibrations attenuated, but one of ordinary skill in the art can readily apply the principles disclosed above in order to pressurize a bellows to exhibit substantially zero lateral stiffness. For instance, one of ordinary skill in the art will recognize whether to pressurize a particular bellows to a pressure more than, less than, or equal to the zero-stiffness pressure in order to achieve the desired vibration attenuation.

Second Representative Embodiment

Figure 3:
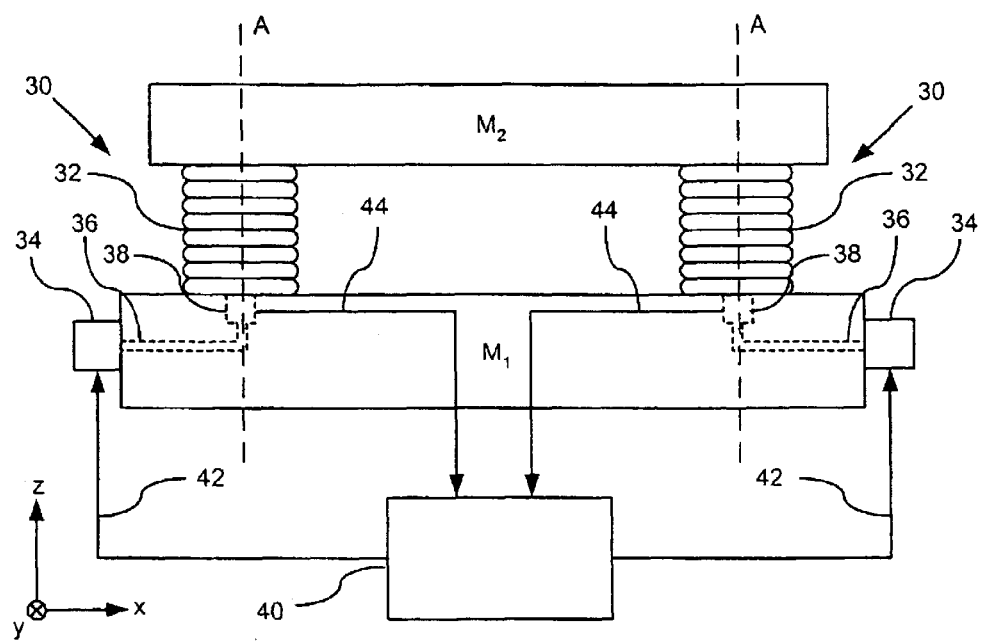
FIG. 3 schematically shows a vibration-attenuation device according to the second representative embodiment.

Two vibration-attenuation devices 30 according to this embodiment are schematically shown in FIG. 3. Vibration-attenuation devices 30 are shown situated between and contacting a first mass $M_1$ and a second mass $M_2$.

Each vibration-attenuation device 30 comprises a bellows 32 aligned along a respective support axis A extending parallel to a Z direction. The device 30 further comprises a pressure regulator 34 connected to the bellows 32 via a conduit 36. The pressure regulator 34 is configured to supply from a fluid source (not shown) and adjust the internal pressure of the bellows 32. The conduit 36 is configured to transfer a fluid from the pressure regulator 34 into the bellows 32. Typically, the conduit 36 is connected to the bellows 32 via an aperture (not shown) located at an axial end of the bellows. Positioned on or near the conduit 36 is a pressure sensor 38 that is configured to measure the internal fluid pressure of the bellows 32.

A controller 40 is connected to the pressure regulator 34 and the pressure sensor 38 via respective connections 42 and 44. The controller 40 controls the internal pressure of bellows 32 in response to the pressure measurements (pressure data) obtained by the pressure sensor 38 such that the internal pressure of the bellows is maintained at a desired value. The desired value of internal pressure will depend upon the particular application for which the vibration-attenuation device 30 is being used. For instance, if the mass of $M_2$ is constant, the internal pressure of the bellows 32 may be continuously monitored and maintained at a pressure at which the bellows exhibits substantially zero lateral stiffness. Alternatively, if the mass of $M_2$ is variable, the internal pressure of the bellows 32 may be correspondingly variable as required such that the pressure is continuously a value at which the bellows exhibits substantially zero lateral stiffness.

Third Representative Embodiment

Figure 4:
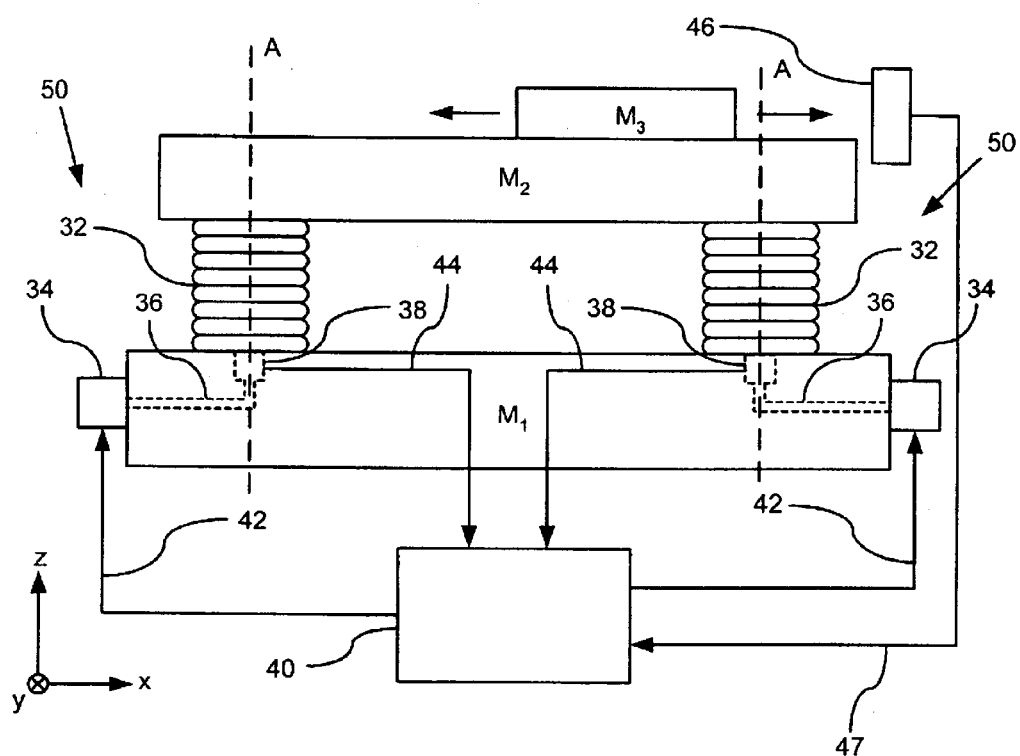
FIG. 4 schematically shows a vibration-attenuation device according to the third representative embodiment.

Two vibration-attenuation devices 50 according to this embodiment are shown in FIG. 4. Components in this embodiment that are identical to corresponding components shown in FIG. 3 have the same respective reference numerals and are not described further. This third embodiment is similar to the second representative embodiment except that the second mass $M_2$ in the third embodiment has a variable center of gravity. This variable center of gravity may be caused, for instance, by the second mass being coupled to a movable mass $M_3$, such as a movable stage supported by the second mass (e.g., a wafer stage or reticle stage in a microlithography system), or by any movable machine portion supported by the second mass. In FIG. 4, the variable center of gravity is schematically shown by the movable mass $M_3$ being supported on the mass $M_2$.

A center-of-gravity sensor 46 is connected to the controller 40 via a connection 47. The sensor 46 provides data concerning the center of gravity of $M_2$ such that the controller 40 may adjust the pressure of the bellows 32 in response to any changes in the center of gravity. Sensor 46 may be a positioning sensor, such as a laser interferometer, configured to detect movement of the movable mass $M_3$. Based on the measured movement, the controller 40 can then calculate any necessary internal pressure adjustments to be made to the bellows 32. For instance, it might be necessary to keep the bellows 32 at a constant internal pressure such that the bellows exhibits substantially zero lateral stiffness at all times. The controller 40 can adjust the pressure inside the bellows 32 in response to the position of the movable mass $M_3$ such that the internal pressure remains constant at a desired pressure.

As is illustrated by FIG. 4, for example, when the movable mass $M_3$ is moved to the right side of the second mass $M_2$, the pressure inside the bellows 32 on the right of FIG. 4 may increase, whereas the pressure inside the bellows 32 on the left of FIG. 4 may decrease. The sensor 46 may detect the position of the movable mass $M_3$ on the second mass $M_2$. Controller 40, which is connected to the sensor 46 via connection 47, may then calculate a proper adjustment based on the data from the sensor 46 and operate to decrease the pressure inside the right bellows 32 and increase the pressure inside the left bellows in order to maintain the internal pressure of the bellows at the zero-stiffness pressure. Alternatively, the controller 40 may operate to adjust the internal pressures of the bellows 32 such that the second mass $M_2$ remains in a constant plane.

The sensor 46 might also comprise multiple sensors placed on the second mass $M_2$ and configured to measure the force directed toward the first mass $M_1$. The controller 40 can then adjust the pressure inside the bellows 32 in response to the force measured by the multiple sensors such that the internal pressure remains at a pressure at which the bellows exhibits substantially zero lateral stiffness.

Fourth Representative Embodiment

Figure 5:
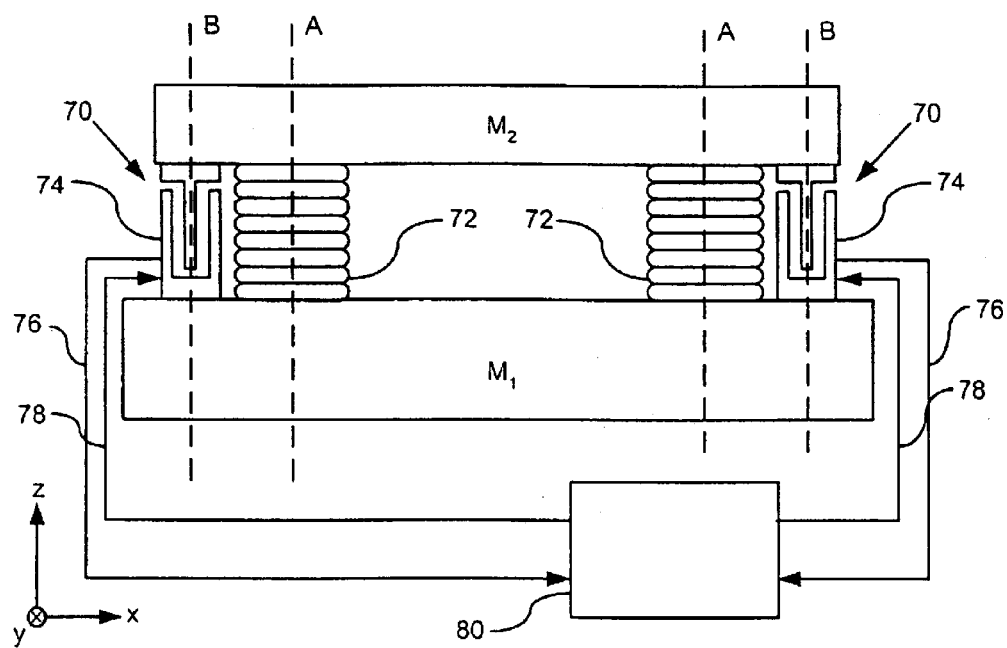
FIG. 5 schematically shows a vibration-attenuation device according to the fourth representative embodiment.

Two vibration-attenuation devices 70 according to this embodiment are shown in FIG. 5. Each vibration-attenuation device 70 comprises a bellows 72 and an active support 74, both situated between and contacting the masses $M_1$ and $M_2$. The bellows 72 and active support 74 are aligned along respective support axes A and B extending parallel to a Z direction.

The inside of the bellows 72 is pressurized with a fluid to a pressure at which the bellows exhibits substantially zero lateral stiffness. In this embodiment, the bellows 72 supports a greater portion of the second mass $M_2$ than the active support 74. Thus, the bellows 72 provides a "primary" support force, and the active support 74 provides a "secondary" support force for the second mass $M_2$. Thus, the power required for operating the active support 74 and the possible deleterious effects caused by high power usage can be minimized.

The active support 74 can be, for example, any of various types of linear motors and analogous actuators that create little or no internal vibration and exhibit a low lateral stiffness. For example, the active support 74 can be an electromagnetic actuator comprising a voice coil motor, a variable reluctance actuator, or an EI-core. Additionally, any number of active supports 74 may be used in conjunction with the bellows 72 to form the vibration-attenuation device 70. Moreover, the vibration-attenuation device 70 may further comprise any of the components discussed with respect to the second and third representative embodiments.

The active support 74 is further configured to sense and produce data concerning a support force corresponding to the amount of support force the active support 74 is actually providing to the second mass $M_2$. The controller 80 is connected to the active support 74 via connections 76 and 78. The controller 80 is configured to receive the support-force data from the active support 74 via the connection 76 and to adjust the support force to a desired value via the connection 78.

For example, if the mass $M_2$ is constant, the support force provided by the active support 74 can be continuously monitored and maintained at a force such that the pressure inside the bellows 72 remains constant at a value at which the bellows exhibits substantially zero lateral stiffness. Alternatively, if the mass $M_2$ varies, the support force provided by the active support 74 can be constantly monitored and adjusted such that the mass $M_2$ remains properly supported and the pressure inside the bellows 72 allows the bellows to exhibit substantially zero lateral stiffness.

Fifth Representative Embodiment

Figure 6:
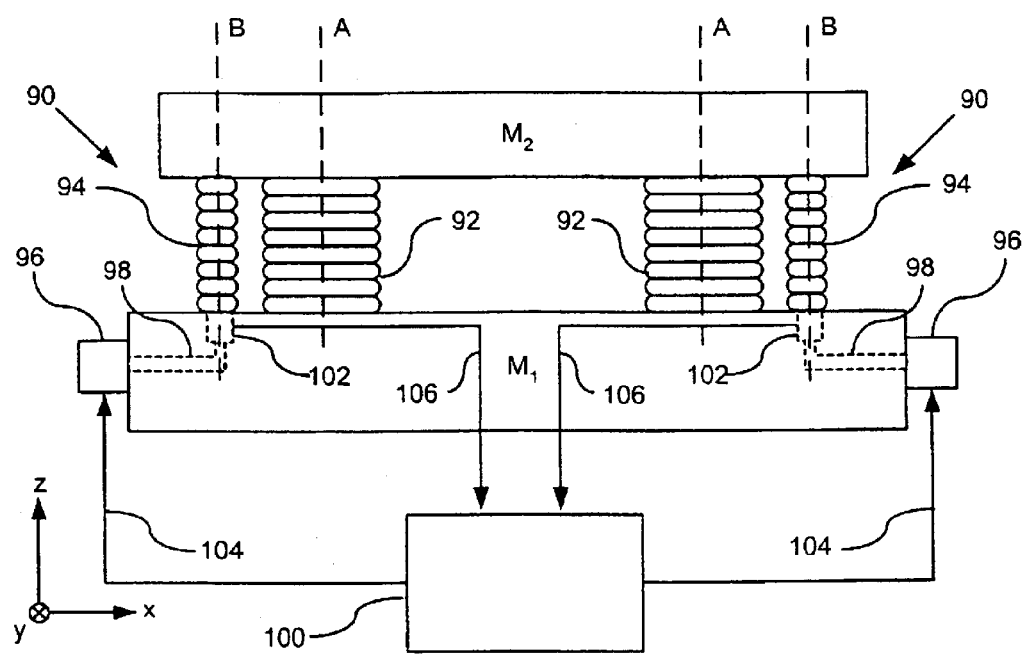
FIG. 6 schematically shows a vibration-attenuation device according to the fifth representative embodiment.

Two vibration-attenuation devices 90 according to this embodiment are shown in FIG. 6. This fifth embodiment is similar to the fourth representative embodiment except the bellows 92 in the fifth embodiment is termed the "primary" bellows and the active support 94 comprises a "secondary" bellows (compliant chamber) having an interior volume smaller than the interior volume of the primary bellows 92. The smaller volume of the secondary bellows 94 allows for its internal pressure to be more easily and quickly adjusted over a wide range of pressures. Further, the primary bellows 92 is configured to support a greater portion of the second mass $M_2$ than the secondary bellows 94. Thus, the secondary bellows 94 has only a small effect on the transmissibility of vibrations from $M_1$ to $M_2$.

Each vibration-attenuation device 90 further comprises a pressure regulator 96 connected to the secondary bellows 94 via a conduit 98. The pressure regulator 96 is configured to supply and regulate the internal fluid pressure of the secondary bellows 94. The conduit 98 is configured to transfer fluid or gas from the regulator 96 into the secondary bellows 94. Positioned on or near the conduit 98 is a pressure sensor 102 configured to measure the internal pressure of the secondary bellows 94. A controller 100 is connected to the pressure regulator 96 and the pressure sensor 102 via respective connections 104 and 106. The controller 100 controls the internal pressure of the secondary bellows 94 in response to pressure data obtained by pressure sensors 102 such that the internal pressure of the primary bellows 92 may be maintained at a desired value. The possible uses for the present embodiment include those discussed with respect to the fourth representative embodiment.

Sixth Representative Embodiment

Figure 7:
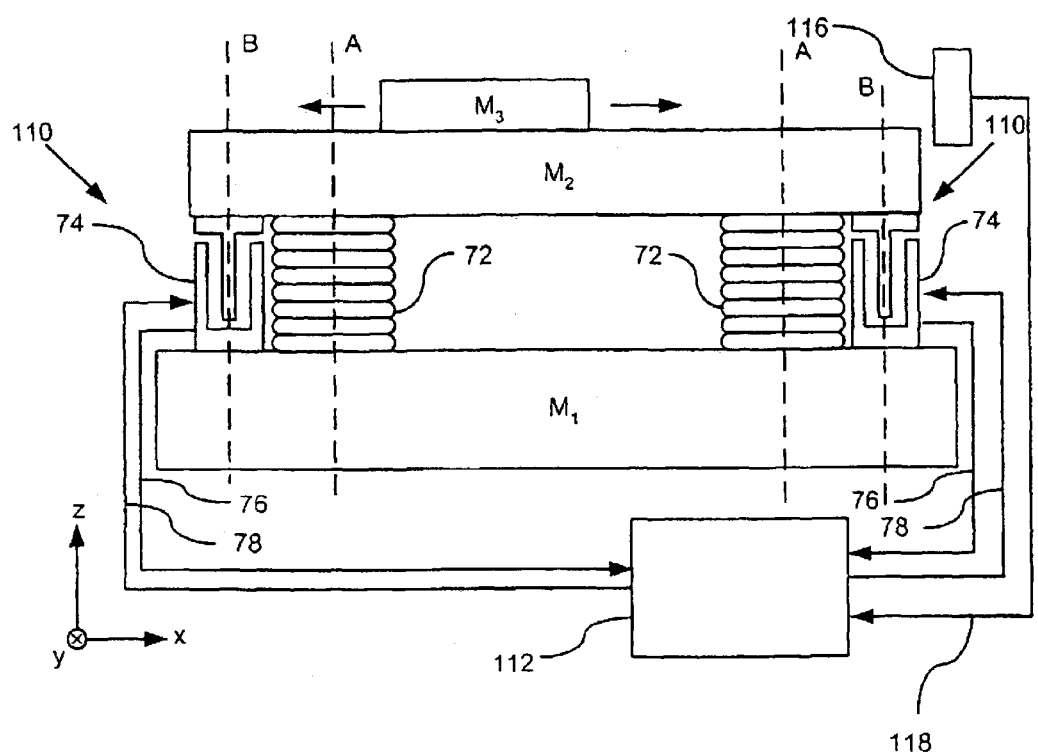
FIG. 7 schematically shows a vibration-attenuation device according to the sixth representative embodiment.

Two vibration-attenuation devices 110 according to this embodiment are shown in FIG. 7. Components in this embodiment that are identical to corresponding components shown in FIG. 5 have the same respective reference numerals and are not described further. This sixth embodiment similar to the fourth representative embodiment except that the second mass $M_2$ in the sixth embodiment has a variable center of gravity. The variable center of gravity may arise by causes similar to causes of a variable center of gravity in the third embodiment. In FIG. 7, the variable center of gravity is schematically shown by a movable mass $M_3$ supported by the mass $M_2$.

A center-of-gravity sensor 116 is connected to the controller 112 via a connection 118. The sensor 116 provides data about the center of gravity of the mass $M_2$ such that the controller 112 may adjust the support force produced by the active support 74 via the connection 78 in response to any changes in the center of gravity. The sensor 116 may be a positioning sensor, such as a laser interferometer, configured to detect movement of the movable mass $M_3$. Alternatively, the sensor 116 may comprise multiple sensors placed on the mass $M_2$ and configured to measure respective forces directed toward the mass $M_1$. Based on the measured forces, the controller 112 can calculate any necessary adjustments to be made to the active support 74. For instance, it might be necessary to keep the bellows 72 at a constant internal pressure such that the bellows exhibits substantially zero lateral stiffness. The controller 112 can adjust the support force produced by the active controller 74 in response to the measurements made by the sensor 116 such that the pressure remains at the desired pressure. Alternatively, the sensor 116 can be configured to detect the plane in which the mass $M_2$ is positioned. Thus, if it is desirable to orient the mass $M_2$ in a certain desired plane, the controller 112 can adjust the support force produced by the active controller 74 in response to data produced by the sensor 116 such that the mass $M_2$ is positioned in its desired plane.

Any number of active supports 74 may be used in conjunction with the bellows 72 to form a vibration-attenuation device 110. Moreover, each vibration-attenuation device 110 may further comprise any of the components discussed with respect to the other representative embodiments.

Seventh Representative Embodiment

Figure 8:
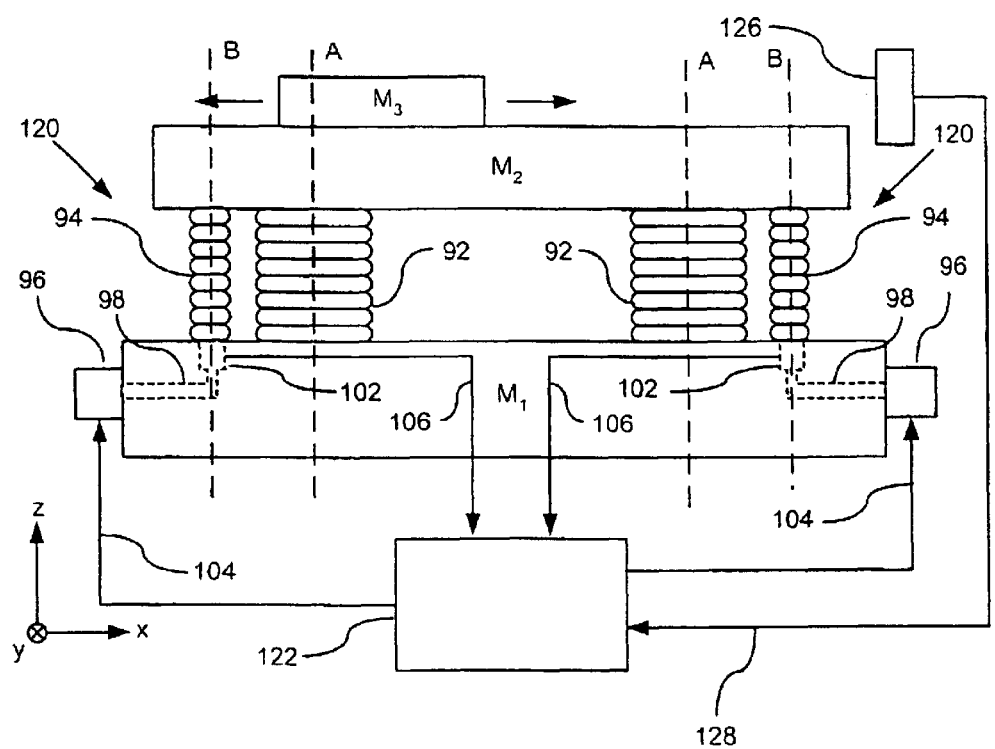
FIG. 8 schematically shows a vibration-attenuation device according to the seventh representative embodiment.

Two vibration-attenuation devices 120 according to this embodiment are shown in FIG. 8. Components in this embodiment that are identical to corresponding components shown in FIG. 6 have the same respective reference numerals and are not described further. This seventh embodiment is similar to the fifth representative embodiment except that the second mass $M_2$ has a variable center of gravity, such as discussed with respect to the sixth embodiment. A center-of-gravity sensor 126 and a connection 128 are substantially identical to corresponding components discussed with respect to the sixth representative embodiment. Further, the uses of this embodiment are substantially identical to the uses of the sixth representative embodiment.

Eighth Representative Embodiment

As noted above, vibration-attenuation devices as disclosed herein can be used in any of various types of machines in which the particular capabilities of the devices can be exploited beneficially. Due to the extremely high-accuracy performance required in lithography, an especially important application for the vibration-attenuation devices described above is in a lithographic exposure apparatus. Hence, this embodiment is directed to a lithographic exposure apparatus comprising one or more vibration-attenuation devices according to any of the representative embodiments disclosed herein.

Figure 9:
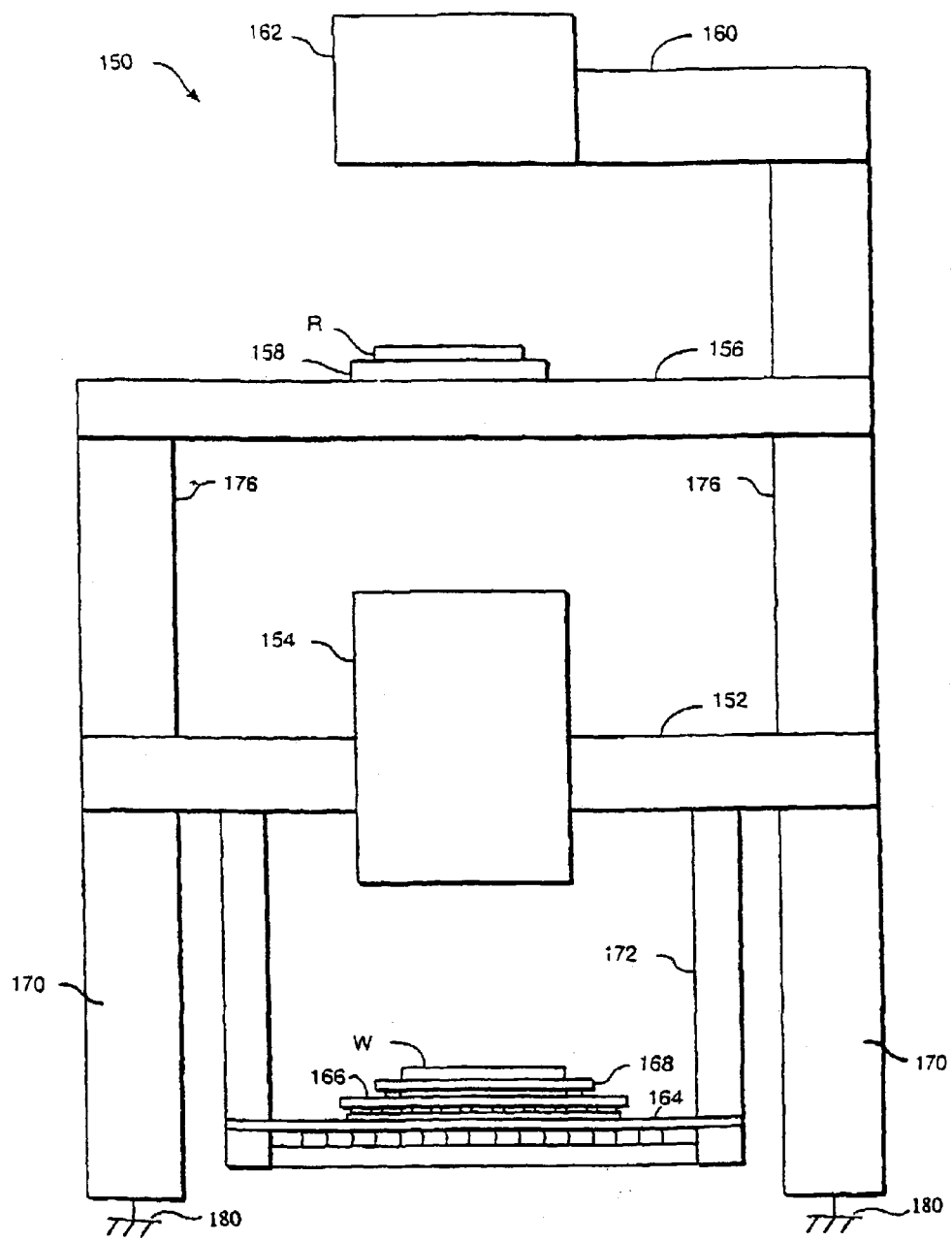
FIG. 9 is a schematic elevational view of a lithographic exposure apparatus according to the eighth representative embodiment.
Figure 10:
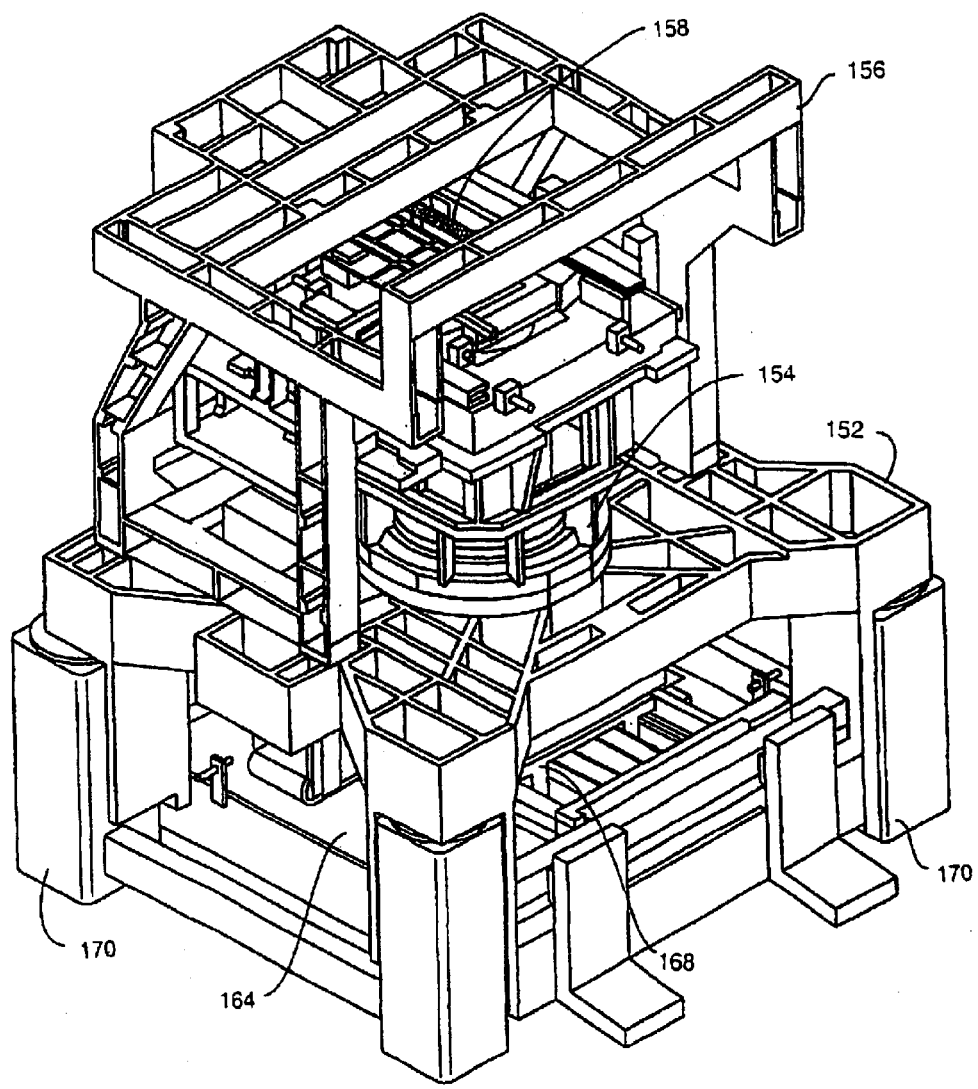
FIG. 10 is a perspective view of a lithographic exposure apparatus according to the eighth representative embodiment.

A lithographic exposure apparatus according to this embodiment is shown in FIGS. 9 and 10. Generally, in a lithographic exposure apparatus, the vibration-attenuation device(s) can be used for attenuating vibration between a support frame of the apparatus and a support surface supporting the apparatus (e.g., a floor). Many of the components and their interrelationships in this apparatus are known in the art, and thus are not described in detail herein.

FIG. 9 schematically shows a lithographic exposure apparatus 150 according to the principles of this embodiment. The lithographic exposure apparatus 150 comprises a wafer (W) positioned on a wafer stage 168. The wafer stage 168 is connected to a stage assembly 166 configured to move the wafer stage 168 to various positions in the XY-plane through a motor means (not shown). The wafer stage 168 and stage assembly 166 are supported by a base 164. The wafer stage 168 and stage assembly 166 further include Z bearings that ride on the surface of the base 164. The base 164 is preferably formed of granite or other very planar and dimensionally stable material and provides a smooth surface for the stage assembly 166 to ride on. The base 164 is rigidly attached to a base frame 172 attached to a support frame 152. The support frame 152 is coupled to a support surface 180 by multiple vibration-attenuation devices 170 according to any of the representative embodiments described above. For best results, the number of vibration-attenuation devices 170 situated between the support frame 152 and the support surface is at least three. The lithographic exposure apparatus 150 further comprises an illumination-optical system 162 supported by an illumination-optical-system frame 160, a reticle stage 158 (configured for holding a reticle R) supported by a reticle-stage frame 156 and a vertical-support frame 176, and a projection-optical system 154 supported by a support frame 152.

FIG. 10 is a perspective view of an exemplary lithographic exposure apparatus according to the principles of this embodiment. The wafer stage 168 is supported above the base 164, and the base 164 is connected to the support frame 152. The support frame 152 is isolated from the support surface (refer to FIG. 9) by respective vibration-attenuation devices 170 located at each corner of the support frame 152. The support frame 152 also supports the projection-optical system 154 and the reticle-stage frame 156. The reticle-stage frame 156 supports the reticle stage 158.

Ninth Representative Embodiment

Figure 11:
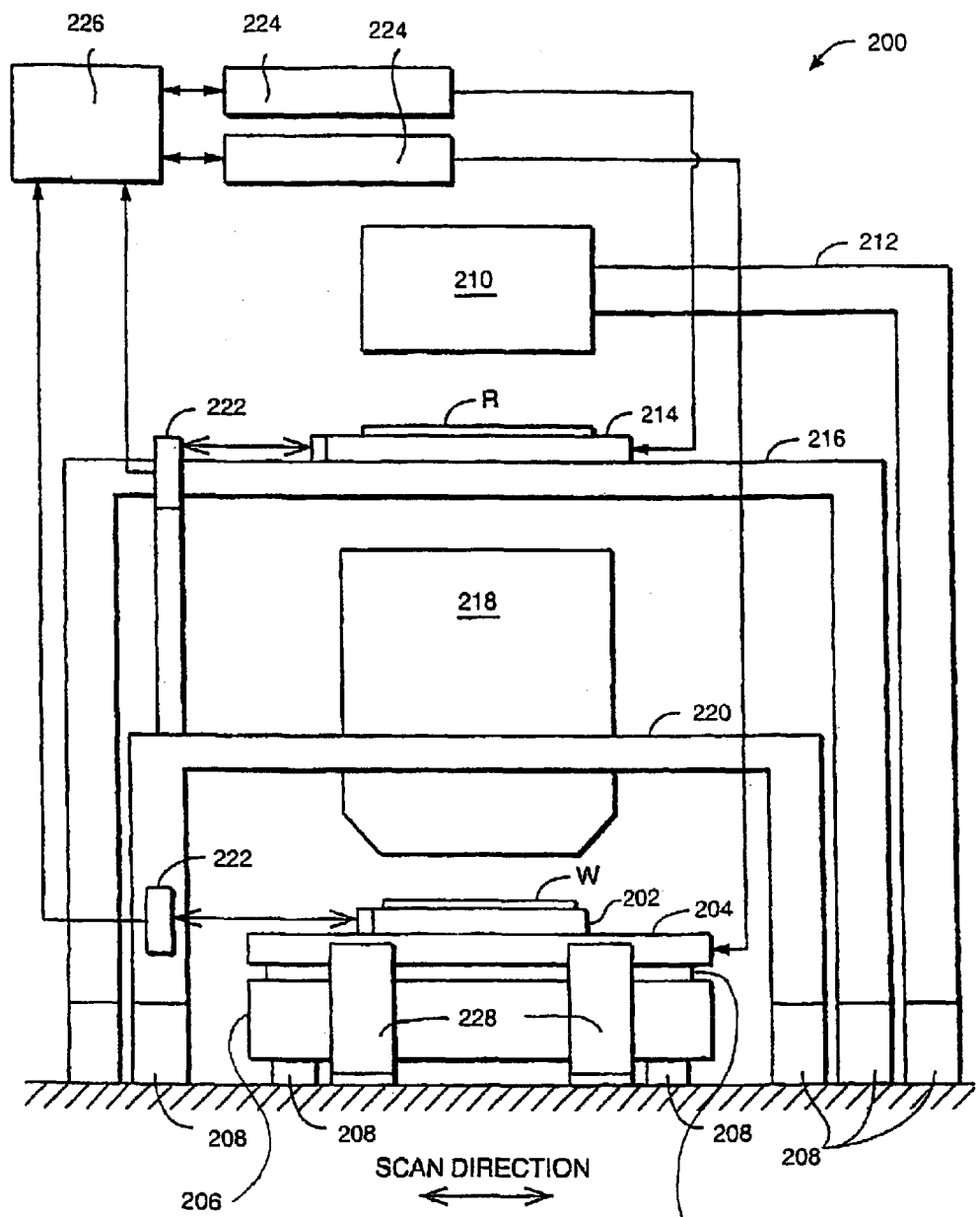
FIG. 11 is a schematic elevational view of a lithographic exposure apparatus according to the ninth representative embodiment.

A lithography system according to this embodiment is shown in FIG. 11. The lithography system includes at least one vibration-attenuation device utilized in association with supporting a stage. Many of the components and their interrelationships in this apparatus are known in the art, and are therefore not described in detail herein.

FIG. 11 schematically shows the subject lithography system 200. The lithographic system 200 is configured to hold a wafer (W) mounted on a stage 202. The stage 202 is mounted on a platform 204, which is configured to move the stage to various positions in the XY-plane through a motor means (not shown). The motor means utilizes, for example, electromagnetic forces generated by magnets and corresponding armature coils. The reaction force generated by the motion of the platform 204 can be mechanically transmitted to the support surface via supports 228. The platform 204 is coupled to a base 206 via one or more vibration-attenuation devices 208 according to any of the representative embodiments discussed above. In one specific embodiment, three vibration-attenuation devices 208 are used to support the platform 204.

The platform 204 also may be structured so that it can move in multiple (e.g., three to six) degrees of freedom. Drive-control units 224 and a controller 226 can control the position and orientation of the platform 204 precisely relative to a projection-optical system 218 based on data received from interferometers 222, used to detect the position of the stage 202. The platform 204 may be as described in U.S. patent application Ser. No. 09/988,520. As far as is permitted, the disclosure of U.S. patent application Ser. No. 09/988,520 is incorporated herein by reference.

The lithography system 200 further comprises an illumination-optical system 210 supported by an illumination-optical-system frame 212, a reticle stage 214 (configured for holding a reticle R) supported by a reticle-stage frame 216, and the projection-optical system 218 supported by a projection-optical-system frame 220. Any of the respective frames 212, 216, 220 may also be coupled to the ground via respective vibration-attenuation devices 208 according to any one of the representative embodiments discussed above. Any of various other vibration-attenuation devices can be used alternatively or in combination with vibration-attenuation devices 208.

Tenth Representative Embodiment

Figure 12:
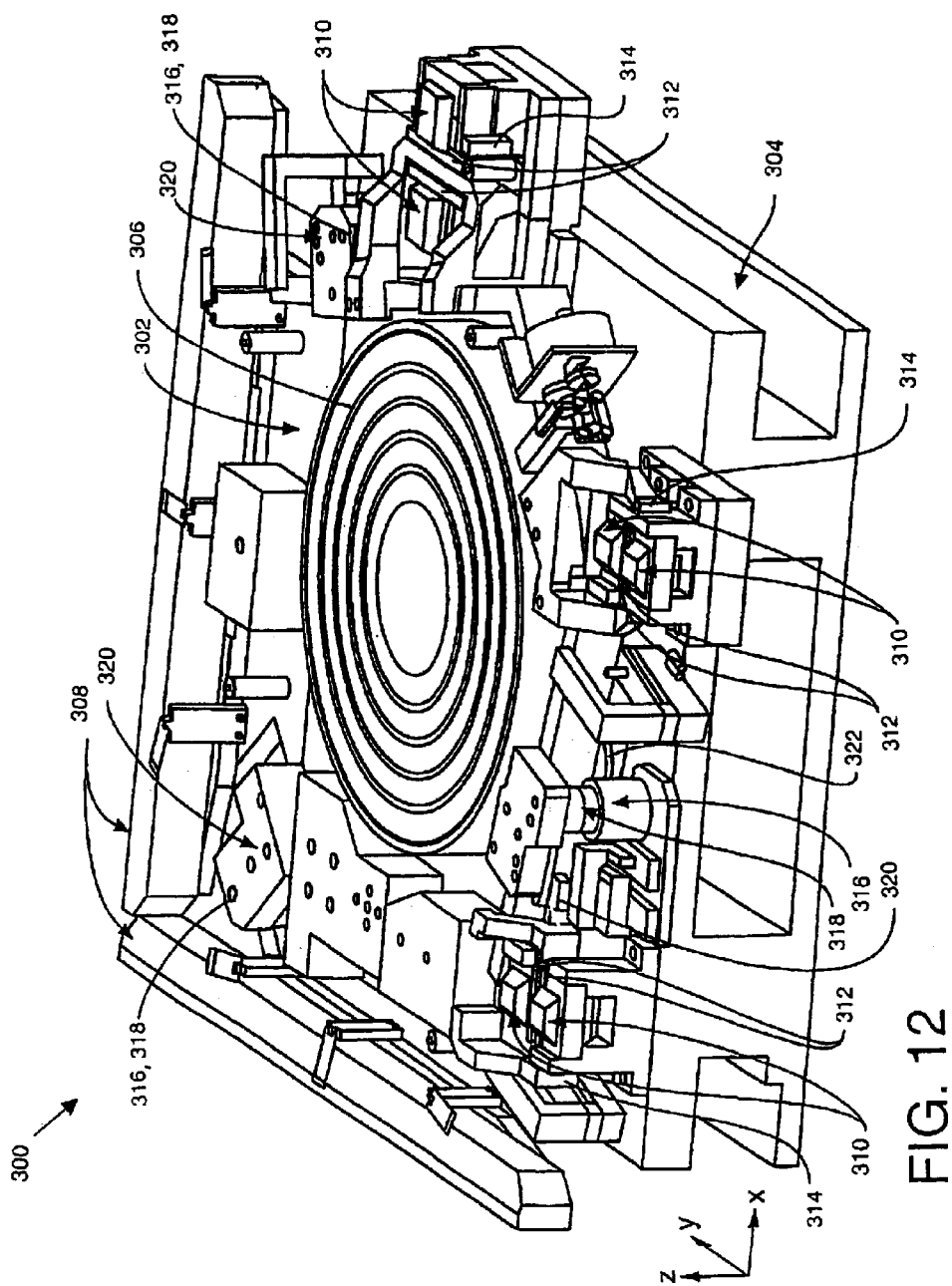
FIG. 12 is a perspective view of an exemplary wafer-stage assembly according to the tenth representative embodiment.
Figure 13:
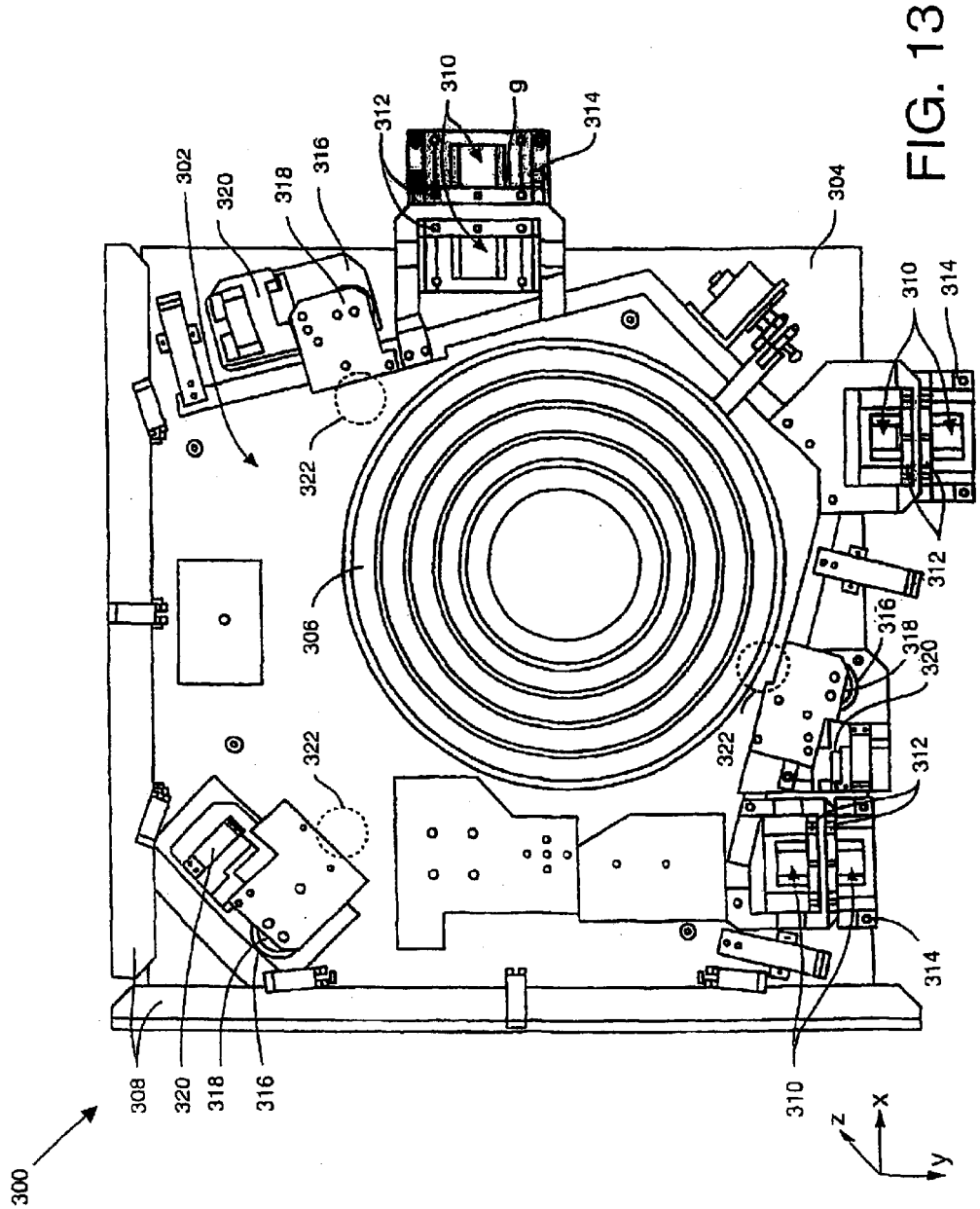
FIG. 13 is a plan view of an exemplary wafer-stage assembly according to the tenth representative embodiment.

A wafer-stage assembly according to this embodiment is shown in FIGS. 12 and 13. The wafer-stage assembly, for use in a lithography system, includes at least one vibration-attenuation device according to the disclosed embodiments. In general, one or more vibration-attenuation device(s) are utilized to isolate a fine stage from vibrations arising in a support stage of the wafer-stage assembly.

FIG. 12 is a perspective view of the subject wafer-stage assembly, and FIG. 13 is a planar view of the assembly. The wafer-stage assembly 300 comprises a fine stage 302 that is movable relative to a support stage 304. A wafer chuck 306 is mounted on the fine stage 302 and configured to hold a wafer (not shown) in a secure position. Mirrors 308 are mounted on the fine stage 302 and aligned with the X and Y axes, respectively, such that the mirrors may be used by respective laser interferometer systems to determine the precise X-Y position of the fine stage 302. Three pairs of electromagnets 310 are mounted to the support stage 304 and interact with three corresponding pairs of electromagnetic targets 312 mounted on extending webs of the fine stage 302. When energized, the electromagnets 310 and their corresponding targets 312 function as linear actuators configured to move the fine stage 302 through a small range of motion in three planar degrees of freedom (X, Y, and $\theta_z$). Three short-range sensors 314 measure respective distances between the fine stage 302 and the support stage 304 in the three degrees of freedom of motion. Additionally, three voice-coil-motor magnets 316 are attached to the support stage 304. Three corresponding voice-coil-motor coils 318 are attached to the fine stage 302 to levitate the fine stage in three vertical degrees of freedom (Z, $\theta_x$, $\theta_y$). Three linear sensors 320 are used to measure the relative position of the fine stage 302 in the three vertical degrees of freedom. Alternatively, the three voice-coil-motor magnets and coils 316, 318 could be replaced by three small controllable bellows configured to move the fine stage 302. To prevent the voice-coil-motor coils 318 from overheating, most of the mass of the fine stage 302 is supported by respective bellows 322 located next to each voice-coil-motor coil 318.

Each bellows 322 is desirably configured according to any one of the first through third embodiments discussed above. Each bellows 322 is internally pressurized with a suitable fluid (e.g., air) to a pressure value at which the bellows exhibits substantially zero lateral stiffness. In such a configuration, the bellows 322 exhibits very low stiffness in all six degrees of freedom and does not significantly interfere with the control of fine stage 302. The stage assembly 300 is more thoroughly described in co-pending PCT application No. WO 01/81171 filed on Apr. 21, 2000. As far as is permitted, the disclosure of PCT application No. WO 01/81171 is incorporated herein by reference.

Eleventh Representative Embodiment

Figure 14:
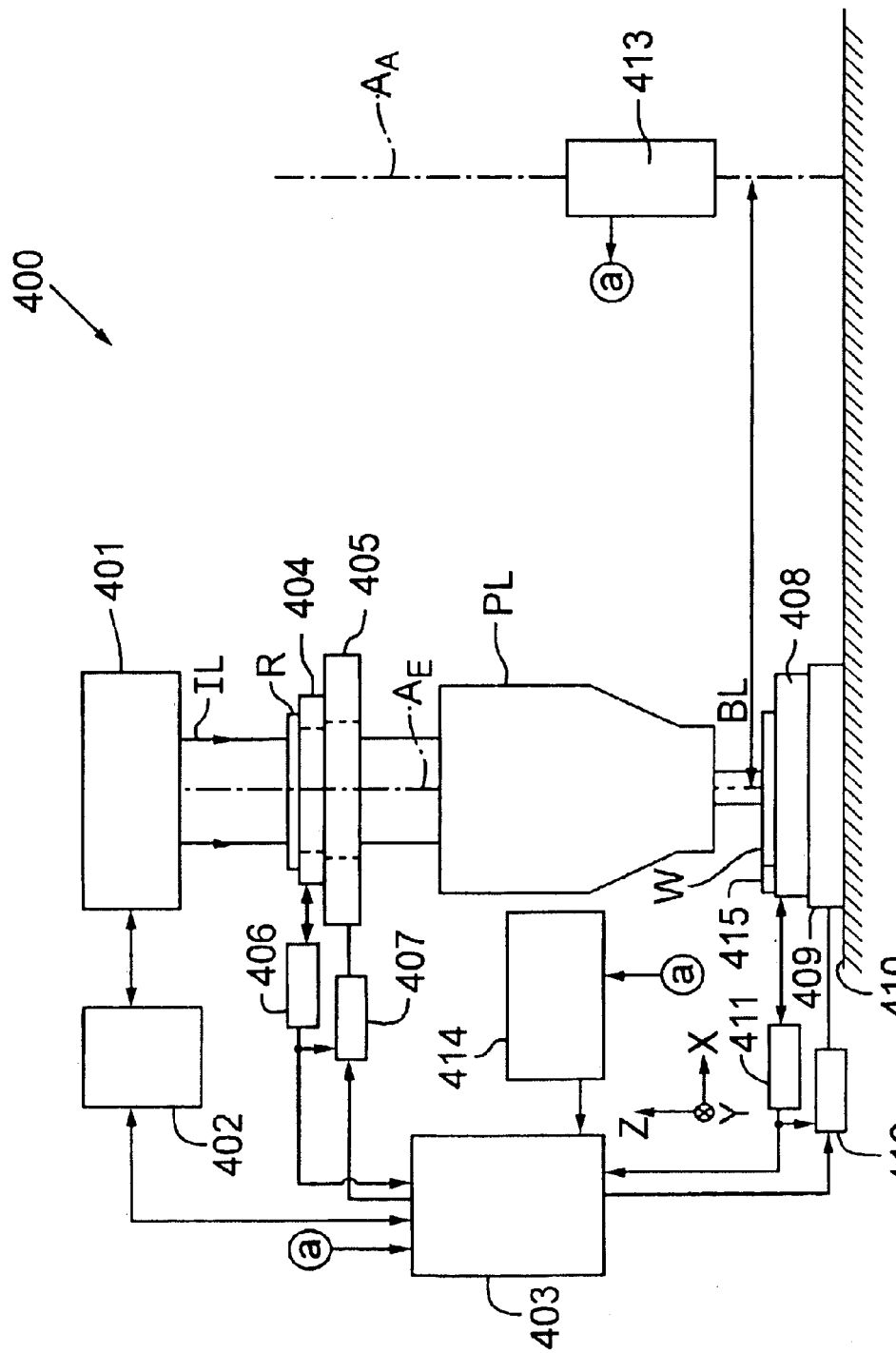
FIG. 14 schematically shows a lithographic exposure apparatus according to the eleventh representative embodiment.

A lithographic exposure apparatus 400 with which any of the foregoing embodiments of vibration-attenuation devices can be used is schematically shown in more detail in FIG. 14. Many of the components and their interrelationships in this apparatus are known in the art, and hence are not described in detail herein.

During exposure, an illumination "light" IL is produced and directed by an illumination-optical system 401 to irradiate a selected region of a reticle R. The illumination-optical system 401 typically comprises an exposure-light source (e.g., ultraviolet light source, extreme ultraviolet light source, charged-particle-beam source), an integrator, a variable field stop, and a condenser lens system or the like. An image of the irradiated portion of the reticle R is projected by a projection-optical system PL onto a corresponding region of a wafer W or other suitable substrate. So as to be imprinted with the image, the upstream-facing surface of the wafer W is coated with a suitable resist. The projection-optical system PL has a projection magnification $\beta$ ($\beta$=⅕ or ¼, for example). An exposure controller 402 is connected to the illumination-optical system 401 and operates to optimize the exposure dose on the wafer W, based on control data produced and routed to the exposure controller 402 by a main control system 403.

In the lithographic exposure apparatus 400 depicted in FIG. 14, the Z-axis extends parallel to an optical axis AE of the projection-optical system PL, the X-axis extends laterally across the plane of the page perpendicularly to the Z-axis, and the Y-axis extends perpendicularly to the plane of the page. The reticle R is mounted on a reticle stage 404, which is operable to position the reticle R relative to a reticle base 405 in the X- and Y-axis directions. The reticle stage 404 also is operable to rotate the reticle R as required about the Z-axis, based on control data routed to the reticle stage 404 by a reticle-stage driver 407 connected to the reticle stage 404. The control data produced by the reticle-stage driver 407 is based upon reticle-stage coordinates as measured by a laser interferometer 406.

The wafer W is mounted to a wafer holder such as a wafer chuck (not detailed), which in turn is mounted to a wafer table 408. The wafer table 408 is mounted to a wafer stage 409 configured to move the wafer table 408 (with wafer chuck) in the X- and Y-axis directions relative to a base 410 supported on vibration-attenuation devices, such as any of the devices described above, relative to a floor or the like. The wafer table 408 is operable to move the wafer chuck and wafer W in the Z-axis direction (focusing direction) relative to the projection-optical system PL. The wafer table 408 also is operable, as part of an auto-focus system (not detailed) to tilt the wafer W relative to the optical axis AE so as to place the wafer surface properly for imaging by the projection-optical system PL. The wafer stage 409 is operable to move the wafer table 408 in a stepping manner in the X- and Y-axis directions, as controlled by a wafer-stage driver 412 connected to the wafer stage 409. The wafer-stage driver 412 receives data concerning the X-Y position of the wafer table 408 as measured by a laser interferometer 411. Exposure of individual shot areas on the wafer W is achieved by performing a respective stepping motion of the wafer stage 409 followed by exposure of an image of the pattern on the reticle R in a step-and-repeat manner.

Typical fabrication processes for microelectronic devices and displays involve multiple microlithography steps of respective patterns onto the wafer in a superposed manner. After exposing a pattern of a particular layer onto the wafer surface, alignment of the reticle R and wafer W should be performed before exposing the subsequent layer. For such a purpose, a reference-mark member 415, defining one or more reference marks, is provided on the wafer table 408. The reticle R is aligned with the reference-mark member 415, based upon alignment measurements obtained using a reticle-alignment microscope (not shown). An alignment sensor 413 (desirably an image-processing type) is situated adjacent the projection-optical system PL and has an axis $A_A$ that is parallel to the axis $A_E$. The alignment sensor 413 desirably comprises an image-pickup device (not detailed) that produces an image signal that is routed to an alignment-signal processor 414. The alignment-signal processor 414 determines respective alignment positions of alignment marks on the wafer W relative to corresponding index marks. The image-processing performance of the alignment-signal processor 414 is disclosed in, for example, U.S. Pat. No. 5,493,403, incorporated herein by reference. An exemplary structure of the reference-mark member 415 and its use for alignment purposes and the like are disclosed in U.S. Pat. No. 5,243,195, incorporated herein by reference.

The apparatus 400 shown in FIG. 14 can be any of various types of microlithography apparatus. For example, as an alternative to operating in a "step-and-repeat" manner characteristic of steppers, the apparatus 400 can be a scanning-type microlithography apparatus operable to expose the pattern from the reticle R to the wafer W while continuously scanning both the reticle R and wafer W in a synchronous manner. During such scanning, the reticle R and wafer W are moved synchronously in opposite directions perpendicular to the optical axis $A_E$. The scanning motions are performed by the respective stages 404, 409.

In contrast, a step-and-repeat microlithography apparatus performs exposure only while the reticle R and wafer W are stationary. If the microlithography apparatus is an "optical lithography" apparatus, the wafer W typically is in a constant position relative to the reticle R and projection-optical system PL during exposure of a given pattern field. After the particular pattern field is exposed, the wafer W is moved, perpendicularly to the optical axis AE and relative to the reticle R, to place the next field of the wafer W into position for exposure. In such a manner, images of the reticle pattern are exposed sequentially onto respective fields on the wafer W.

Pattern-exposure apparatus as provided herein are not limited to microlithography apparatus for manufacturing microelectronic devices. As a first alternative, for example, the apparatus can be a liquid-crystal-device (LCD) microlithography apparatus used for exposing a pattern for a liquid-crystal display onto a glass plate. As a second alternative, the apparatus can be a microlithography apparatus used for manufacturing thin-film magnetic heads. As a third alternative, the apparatus can be a proximity-microlithography apparatus used for exposing, for example, a mask pattern. In this alternative, the mask and substrate are placed in close proximity with each other, and exposure is performed without having to use a projection-optical system PL.

The principles of the invention as described above further alternatively can be used with any of various other apparatus, including (but not limited to) other microelectronic-processing apparatus, machine tools, metal-cutting equipment, and inspection apparatus.

In any of various microlithography apparatus as described above, the source (in the illumination-optical system 401) of illumination "light" can be, for example, a g-line source (438 nm), an i-line source (365 nm), a KrF excimer laser (248 nm), an ArF excimer laser (193 nm), or an $F_2$ excimer laser (157 nm). Alternatively, the source can be of a charged particle beam such as an electron or ion beam, or a source of X-rays (including "extreme ultraviolet" radiation). If the source produces an electron beam, then the source can be a thermionic-emission type (e.g., lanthanum hexaboride or $LaB_6$ or tantalum (Ta)) of electron gun. If the illumination "light" is an electron beam, the pattern can be transferred to the wafer W from the reticle R or directly to the wafer W without using a reticle.

With respect to the projection-optical system PL, if the illumination light comprises far-ultraviolet radiation, the constituent lenses are made of UV-transmissive materials such as quartz and fluorite that readily transmit ultraviolet radiation. If the illumination light is produced by an $F_2$ excimer laser or EUV source, then the lenses of the projection-optical system PL can be either refractive or catadioptric, and the reticle R desirably is a reflective type. If the illumination "light" is an electron beam (as a representative charged particle beam), then the projection-optical system PL typically comprises various charged-particle-beam optics such as electron lenses and deflectors, and the optical path should be in a suitable vacuum. If the illumination light is in the vacuum ultraviolet (VUV) range (less than 200 nm), then the projection-optical system PL can have a catadioptric configuration with beam splitter and concave mirror, as disclosed for example in U.S. Pat. Nos. 5,668,672 and 5,835,275, incorporated herein by reference. The projection-optical system PL also can have a reflecting-refracting configuration including a concave mirror but not a beam splitter, as disclosed in U.S. Pat. Nos. 5,689,377 and 5,892,117, incorporated herein by reference.

Either or both the reticle stage 404 and wafer stage 409 can include respective linear motors for achieving the motions of the reticle R and wafer W, respectively, in the X-axis and Y-axis directions. The linear motors can be air-levitation types (employing air bearings) or magnetic-levitation types (employing bearings based on the Lorentz force or a reactance force). Either or both stages 404, 409 can be configured to move along a respective guide or alternatively can be guideless. See U.S. Pat. Nos. 5,623,853 and 5,528,118, incorporated herein by reference.

Further alternatively, either or both stages 404, 409 can be driven by a planar motor that drives the respective stage by electromagnetic force generated by a magnet unit having two-dimensionally arranged magnets and an armature-coil unit having two-dimensionally arranged coils in facing positions. With such a drive system, either the magnet unit or the armature-coil unit is connected to the respective stage and the other unit is mounted on a moving-plane side of the respective stage.

Movement of a stage 404, 409 as described herein can generate reaction forces that can affect the performance of the microlithography apparatus. Reaction forces generated by motion of the wafer stage 409 can be attenuated using any of the vibration-attenuation devices described above. Alternatively, the reaction forces can be shunted to the floor (ground) using a frame member as described, e.g., in U.S. Pat. No. 5,528,118, incorporated herein by reference. Reaction forces generated by motion of the reticle stage 404 can be attenuated using any of the vibration-attenuation devices described above or shunted to the floor (ground) using a frame member as described in U.S. Pat. No. 5,874,820, incorporated herein by reference.

A microlithography apparatus such as any of the various types described above can be constructed by assembling together the various subsystems, including any of the elements listed in the appended claims, in a manner ensuring that the prescribed mechanical accuracy, electrical accuracy, and optical accuracy are obtained and maintained. For example, to maintain the various accuracy specifications, before and after assembly, optical system components and assemblies are adjusted as required to achieve maximal optical accuracy. Similarly, mechanical and electrical systems are adjusted as required to achieve maximal respective accuracies. Assembling the various subsystems into a microlithography apparatus requires the making of mechanical interfaces, electrical-circuit wiring connections, and pneumatic plumbing connections as required between the various subsystems. Typically, constituent subsystems are assembled prior to assembling the subsystems into a microlithography apparatus. After assembly of the apparatus, system adjustments are made as required for achieving overall system specifications in accuracy, etc. Assembly at the subsystem and system levels desirably is performed in a clean room where temperature and humidity are controlled.

Twelfth Representative Embodiment

Figure 15:
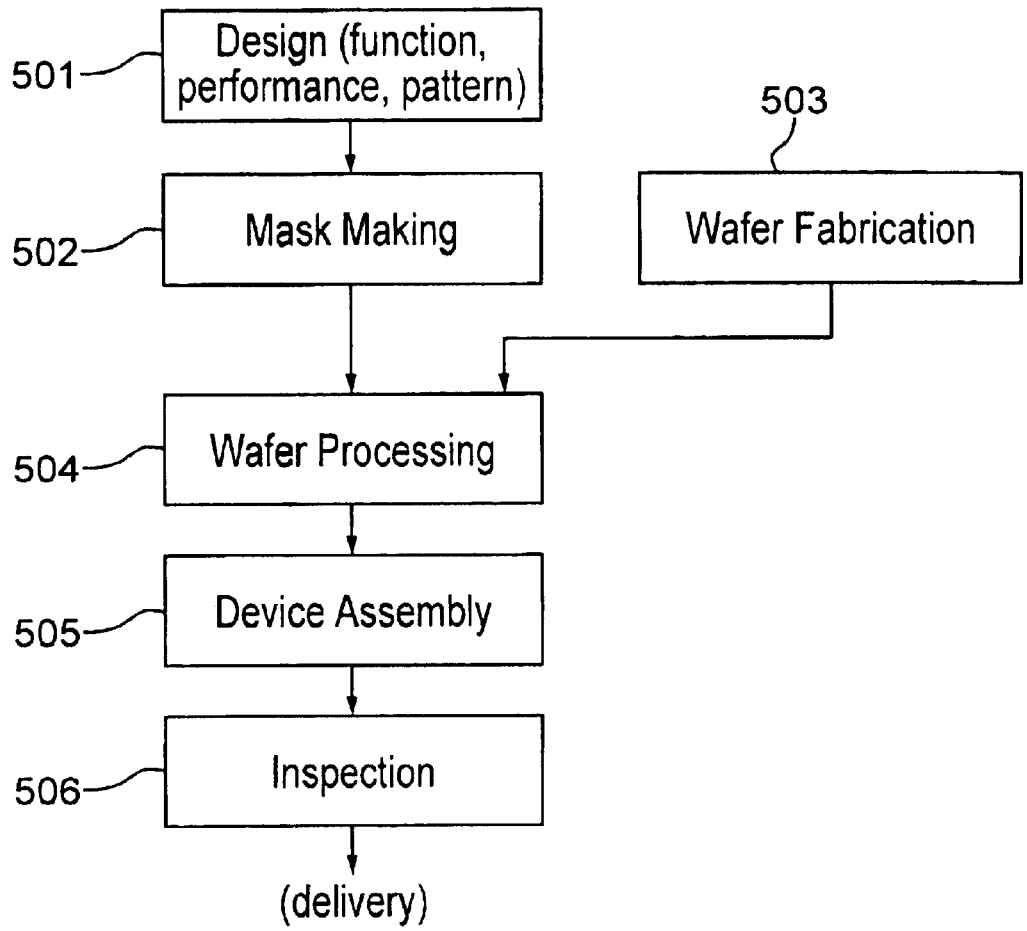
FIG. 15 is a flow chart that outlines a process for manufacturing a device according to the twelfth representative embodiment.

Any of various microelectronic devices and displays can be fabricated using an apparatus as described in the eleventh representative embodiment. An exemplary process is depicted in FIG. 15. In step 501, the function and performance characteristics of the subject device are designed. Next, in step 502, a mask (reticle) defining a corresponding pattern is designed according to the specifications established in the preceding step. In a parallel step 503 to step 502, a wafer or other suitable substrate is made. In step 504, the mask pattern designed in step 502 is exposed onto the wafer using a microlithography apparatus as described herein. In step 505, the microelectronic device is assembled; this typically includes dicing, bonding, and packaging steps as well known in the art. Finally, in step 506, the devices are inspected.

Figure 16:
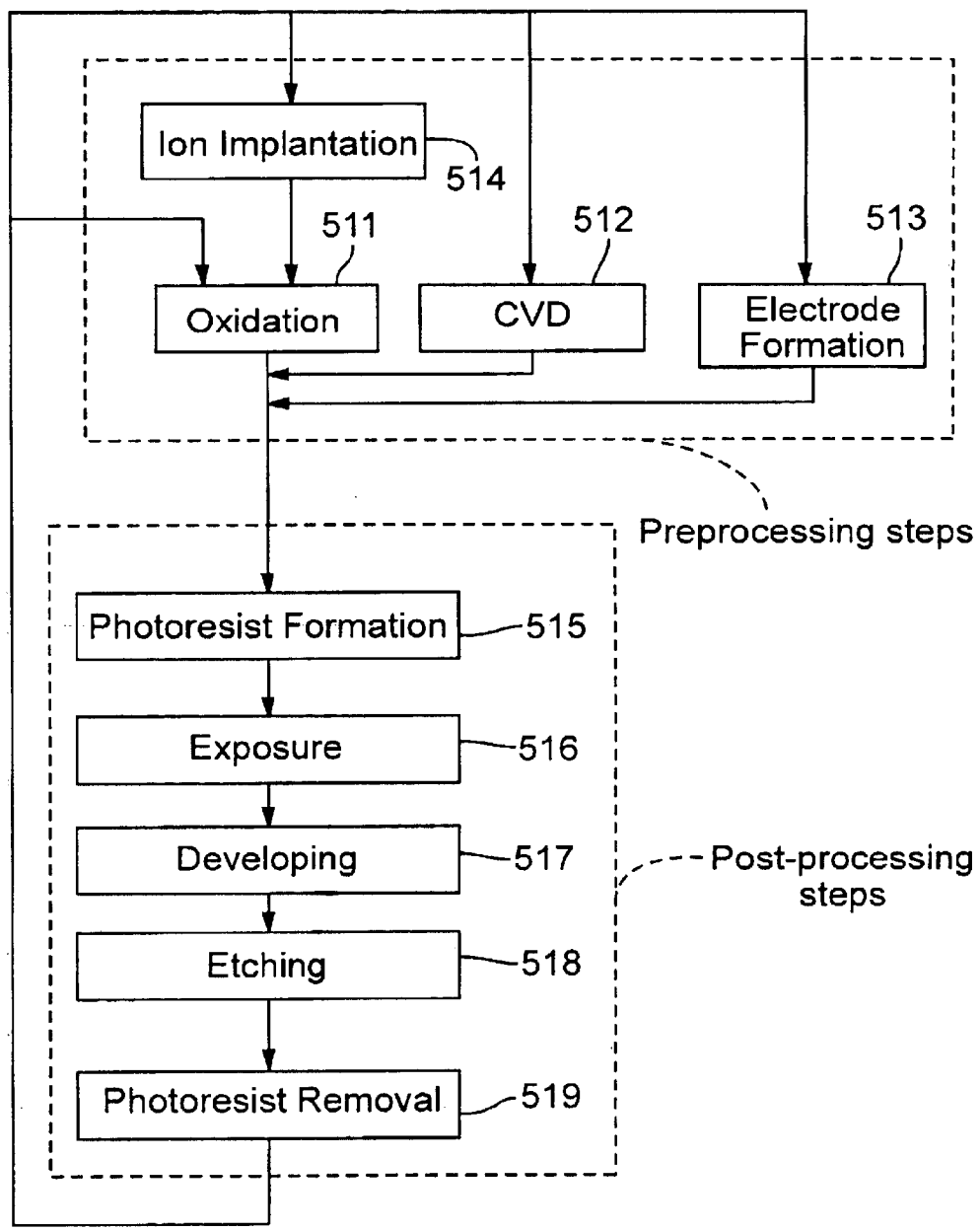
FIG. 16 is a flow chart that outlines certain details of one of the steps in FIG. 15.

FIG. 16 is a flow chart of the details of step 504, as applied to manufacturing microelectronic devices. In step 511 (oxidation), the surface of the wafer is oxidized. In step 512 ("CVD" or chemical vapor deposition), an insulating film is formed on the wafer surface. In step 513 (electrode formation), electrodes are formed on the wafer by vapor deposition. In step 514 (ion implantation), ions are implanted in the wafer. These steps 511-514 constitute the "pre-process" steps for wafers during wafer processing; during these steps selections are made as required according to processing requirements.

Continuing further with FIG. 16, at each stage of wafer processing, after the above-mentioned pre-process steps are completed, the following "post-process" steps are executed. Initially, in step 515 (photoresist formation), a layer of a suitable resist is applied to the wafer surface. Next, in step 516 (exposure), the microlithography apparatus is used to transfer the circuit pattern defined by the mask (reticle) to the wafer. In step 517 (developing), the exposed layer of resist on the wafer surface is developed. In step 518 (etching), portions of the wafer surface not protected by residual resist are removed by etching. In step 519 (photoresist removal), any resist remaining after completing the etching step is removed.

Multiple circuit patterns are formed on the wafer surface by repeating these pre-process and post-process steps as required.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A device for placement between a first mass and a second mass for attenuating transmission of lateral vibration from one of the masses to the other of the masses, the device comprising at least one bellows situated along a respective support axis between the first and second masses and configured to be pressurized with a fluid, the bellows defining an interior volume that is pressurized to an internal fluid pressure substantially equal to a zero-stiffness pressure such that the bellows exhibits a substantially zero lateral stiffness.

2. The device of claim 1, wherein the interior volume of the bellows is pressurized to an internal fluid pressure greater than the zero-stiffness pressure.

3. The device of claim 1, wherein the interior volume of the bellows is pressurized to an internal fluid pressure less than the zero-stiffness pressure.

4. The device of claim 1, wherein the interior volume of the bellows is connected to a fluid source configured to supply the internal fluid pressure to the bellows.

5. The device of claim 4, further comprising:
   a pressure sensor in fluid communication with the interior volume of the bellows and configured for producing pressure data corresponding to the internal pressure of the bellows; and
   a pressure regulator fluidly connected to the bellows and to the fluid source, the pressure regulator being configured to adjust the pressure, supplied by the fluid source to the interior volume, in response to the pressure data.

6. The device of claim 5, further comprising a controller connected to the pressure sensor and to the pressure regulator, the controller being configured to change the internal fluid pressure in the bellows in response to the pressure data.

7. The device of claim 4, further comprising:
   a pressure sensor in fluid communication with the interior volume of the bellows and configured for producing pressure data corresponding to the internal pressure of the bellows; and a controller connected to the pressure sensor and configured for changing an amount of fluid delivered by the fluid source to the interior volume in response to the pressure data.

8. The device of claim 4, further comprising a controller situated and configured for changing an amount of fluid delivered by the fluid source to the interior volume so as to establish the internal fluid pressure.

9. The device of claim 8, wherein the second mass is supported by the device and has a variable center of gravity, the device further comprising a center-of-gravity sensor connected to the controller and configured to detect changes in the center of gravity of the second mass, the controller being further configured to change the internal fluid pressure in the bellows in response to the changes in the center of gravity.

10. The device of claim 9, wherein the center-of-gravity sensor comprises at least one laser interferometer.

11. The device of claim 1, wherein the bellows provides a primary support force along the support axis, the support axis being a primary support axis, the apparatus further comprising at least one active support situated relative to the bellows on a respective secondary support axis and configured to provide a secondary support force to at least one of the masses along the secondary support axis.

12. The device of claim 11, comprising multiple bellows situated between the first and second masses, each bellows having associated therewith a respective active support.

13. The device of claim 11, wherein the active support is further configured to measure the secondary support force applied by the active support.

14. The device of claim 13, further comprising a controller connected to the active support and configured to change the secondary support force, in response to the measured secondary support force, to a predetermined value of the secondary support force.

15. The device of claim 14, wherein the controller is further configured to control the secondary support force to maintain the internal fluid pressure of the bellows at the pressure substantially equal to the zero-stiffness pressure such that the bellows maintains a substantially zero lateral stiffness accompanying changes in the secondary support force.

16. The device of claim 13, wherein the second mass is supported by the device and has a variable center of gravity, the device further comprising a center-of-gravity sensor situated and configured to detect changes in the center of gravity of the second mass.

17. The device of claim 16, further comprising a controller connected to the center-of-gravity sensor, the controller being configured to change the secondary support force in response to changes in the center of gravity of the second mass.

18. The device of claim 17, wherein:
the second mass is supported in a plane; and
the controller changes the secondary support force of the active support so as to maintain the second mass in the plane.

19. The device of claim 16, wherein the center-of-gravity sensor comprises at least one laser interferometer.

20. The device of claim 11, wherein the active support comprises an air mount.

21. The device of claim 20, wherein:
the bellows providing the primary support force is a primary bellows; and
the air mount comprises a secondary bellows having an interior volume less than the interior volume of the primary bellows.

22. The device of claim 20, wherein the air mount comprises a respective compliant chamber.

23. The device of claim 11, wherein the active support comprises an electromagnetic actuator configured to generate the secondary support force.

24. The device of claim 23, wherein the electromagnetic actuator comprises a voice coil motor, a variable reluctance actuator, or an EI-core.

25. A lithographic exposure apparatus, comprising:
a support frame for supporting the lithographic exposure apparatus relative to a support surface; and
at least one vibration-attenuation device situated between the support frame and the support surface, the vibration-attenuation device comprising a bellows defining an interior volume configured to be pressurized with a fluid, the bellows being situated along a respective support axis of the support frame and positioned between the support frame and the support surface, wherein the interior volume of the bellows is pressurized to an internal fluid pressure substantially equal to a zero-stiffness pressure such that the bellows exhibits a substantially zero lateral stiffness.

26. The apparatus of claim 25, wherein the interior volume of the bellows is pressurized to an internal fluid pressure greater than the zero-stiffness pressure.

27. The apparatus of claim 25, wherein the interior volume of the bellows is pressurized to an internal fluid pressure less than the zero-stiffness pressure.

28. The apparatus of claim 25, wherein the interior volume of the bellows is connected to a fluid source configured to supply the internal fluid pressure to the bellows.

29. The apparatus of claim 28, wherein the vibration-attenuation device further comprises:
a pressure sensor in fluid communication with the interior volume of the bellows and configured for producing pressure data corresponding to the internal pressure of the bellows; and
a pressure regulator fluidly connected to the bellows and to the fluid source, the pressure regulator being configured to adjust the pressure, supplied by the fluid source to the interior volume, in response to the pressure data.

30. The apparatus of claim 29, wherein the vibration-attenuation device further comprises a controller connected to the pressure sensor and to the pressure regulator, the controller being configured to change the internal fluid pressure in the bellows in response to the pressure data.

31. The apparatus of claim 28, wherein the vibration-attenuation device further comprises:
a pressure sensor in fluid communication with the interior volume of the bellows and configured for producing pressure data corresponding to the internal pressure of the bellows; and
a controller connected to the pressure sensor and configured for changing an amount of fluid delivered by the fluid source to the interior volume in response to the pressure data.

32. The apparatus of claim 28, wherein the vibration-attenuation device further comprises a controller situated and configured for changing an amount of fluid delivered by the fluid source to the interior volume so as to establish the internal fluid pressure.

33. The apparatus of claim 32, wherein the support frame has a variable center of gravity, the vibration-attenuation device further comprising a center-of-gravity sensor connected to the controller and configured to detect changes in the center of gravity of the support frame, the controller being further configured to change the internal fluid pressure in the bellows in response to the changes in the center of gravity.

34. The device of claim 33, wherein the center-of-gravity sensor comprises at least one laser interferometer.

35. The apparatus of claim 25, wherein the bellows provides a primary support force along the support axis, the support axis being a primary support axis, the vibration-attenuation device further comprising at least one active support situated relative to the bellows on a respective secondary support axis and configured to provide a secondary support force to the support frame along the secondary support axis.

36. The apparatus of claim 35, wherein the vibration-attenuation device comprises multiple bellows situated between the support surface and the support frame, each bellows having associated therewith a respective active support.

37. The apparatus of claim 35, wherein the active support is further configured to measure the secondary support force applied by the active support.

38. The apparatus of claim 37, further comprising a controller connected to the active support and configured to change the secondary support force, in response to the measured secondary support force, to a predetermined value of the secondary support force.

39. The apparatus of claim 38, wherein the controller is further configured to control the secondary support force to maintain the internal fluid pressure of the bellows at the pressure substantially equal to the zero-stiffness pressure such that the bellows maintains a substantially zero lateral stiffness accompanying changes in the secondary support force.

40. The apparatus of claim 37, wherein:
the support frame has a variable center of gravity; and
the vibration-attenuation device further comprises a center-of-gravity sensor situated and configured to detect changes in the center of gravity of the support frame.

41. The apparatus of claim 40, wherein:
the vibration-attenuation device further comprises a controller connected to the center-of-gravity sensor; and
the controller is configured to change the secondary support force in response to changes in the center of gravity of the support frame.

42. The apparatus of claim 41, wherein:
the support frame is supported in a plane; and
the controller changes the secondary support force of the active support so as to maintain the support frame in the plane.

43. The apparatus of claim 40, wherein the center-of-gravity sensor comprises at least one laser interferometer.

44. The apparatus of claim 35, wherein the active support comprises an air mount.

45. The apparatus of claim 44, wherein:
the bellows providing the primary support force is a primary bellows; and
the air mount comprises a secondary bellows having an interior volume less than the interior volume of the primary bellows.

46. The apparatus of claim 44, wherein the air mount comprises a respective compliant chamber.

47. The apparatus of claim 35, wherein the active support comprises an electromagnetic actuator configured to generate the secondary support force.

48. The apparatus of claim 47, wherein the electromagnetic actuator comprises a voice coil motor, a variable reluctance actuator, or an EI-core.

49. An object manufactured using the apparatus of claim 25.

50. An apparatus for supporting a stage in a lithography system comprising:
a base;
a platform on which a movable stage is configured to operate; and
at least one vibration-attenuation device situated between the platform and the base, the vibration-attenuation device comprising a bellows defining an interior volume configured to be pressurized with a fluid, the bellows being situated along a respective support axis of the platform and positioned between the platform and the base, wherein the interior volume of the bellows is pressurized to an internal fluid pressure substantially equal to a zero-stiffness pressure such that the bellows exhibits a substantially zero lateral stiffness.

51. The apparatus of claim 50, wherein the interior volume of the bellows is pressurized to an internal fluid pressure greater than the zero-stiffness pressure.

52. The apparatus of claim 50, wherein the interior volume of the bellows is pressurized to an internal fluid pressure less than the zero-stiffness pressure.

53. The apparatus of claim 50, wherein the interior volume of the bellows is connected to a fluid source configured to supply the internal fluid pressure to the bellows.

54. The apparatus of claim 53, wherein the vibration-attenuation device further comprises:
a pressure sensor in fluid communication with the interior volume of the bellows and configured for producing pressure data corresponding to the internal pressure of the bellows; and
a pressure regulator fluidly connected to the bellows and to the fluid source, the pressure regulator being configured to adjust the pressure, supplied by the fluid source to the interior volume, in response to the pressure data.

55. The apparatus of claim 54, wherein the vibration-attenuation device further comprises a controller connected to the pressure sensor and to the pressure regulator, the controller being configured to change the internal fluid pressure in the bellows in response to the pressure data.

56. The apparatus of claim 53, wherein the vibration-attenuation device further comprises:
a pressure sensor in fluid communication with the interior volume of the bellows and configured for producing pressure data corresponding to the internal pressure of the bellows; and
a controller connected to the pressure sensor and configured for changing an amount of fluid delivered by the fluid source to the interior volume in response to the pressure data.

57. The apparatus of claim 53, wherein the vibration-attenuation device further comprises a controller situated and configured for changing an amount of fluid delivered by the fluid source to the interior volume so as to establish the internal fluid pressure.

58. The apparatus of claim 57, wherein the platform has a variable center of gravity, the vibration-attenuation device further comprising a center-of-gravity sensor connected to the controller and configured to detect changes in the center of gravity of the platform, the controller being further configured to change the internal fluid pressure in the bellows in response to the changes in the center of gravity.

59. The device of claim 58, wherein the center-of-gravity sensor comprises at least one laser interferometer.

60. The apparatus of claim 50, wherein the bellows provides a primary support force along the support axis, the support axis being a primary support axis, the vibration-attenuation device further comprising at least one active support situated relative to the bellows on a respective secondary support axis and configured to provide a secondary support force to the platform along the secondary support axis.

61. The apparatus of claim 60, wherein the vibration-attenuation device comprises multiple bellows situated between the support surface and the platform, each bellows having associated therewith a respective active support.

62. The apparatus of claim 60, wherein the active support is configured to move the wafer stage in at least one degree of freedom relative to the supporting stage.

63. The apparatus of claim 60, wherein the active support is configured to move the wafer stage in three degrees of freedom relative to the supporting stage.

64. The apparatus of claim 62, wherein the active support is further configured to measure the secondary support force applied by the active support.

65. The apparatus of claim 64, further comprising a controller connected to the active support and configured to change the secondary support force, in response to the measured secondary support force, to a predetermined value of the secondary support force.

66. The apparatus of claim 65, wherein the controller is further configured to control the secondary support force to maintain the internal fluid pressure of the bellows at the pressure substantially equal to the zero-stiffness pressure such that the bellows maintains a substantially zero lateral stiffness accompanying changes in the secondary support force.

67. The apparatus of claim 64, wherein:
the platform has a variable center of gravity; and
the vibration-attenuation device further comprises a center-of-gravity sensor situated and configured to detect changes in the center of gravity of the platform.

68. The apparatus of claim 67, wherein:
the vibration-attenuation device further comprises a controller connected to the center-of-gravity sensor; and
the controller is configured to change the secondary support force in response to changes in the center of gravity of the platform.

69. The apparatus of claim 68, wherein:
the platform is supported in a plane; and
the controller changes the secondary support force of the active support so as to maintain the platform in the plane.

70. The apparatus of claim 67, wherein the center-of-gravity sensor comprises at least one laser interferometer.

71. The apparatus of claim 62, wherein the active support comprises an air mount.

72. The apparatus of claim 71, wherein:
the bellows providing the primary support force is a primary bellows; and
the air mount comprises a secondary bellows having an interior volume less than the interior volume of the primary bellows.

73. The apparatus of claim 71, wherein the air mount comprises a respective compliant chamber.

74. The apparatus of claim 62, wherein the active support comprises an electromagnetic actuator configured to generate the secondary support force.

75. The apparatus of claim 74, wherein the electromagnetic actuator comprises a voice coil motor, a variable reluctance actuator, or an EI-core.

76. An object manufactured using the apparatus of claim 50.

77. A lithography system, comprising an apparatus for attenuating transmission of a vibration to and from a wafer stage in the lithography system, the apparatus comprising:
a frame;
a wafer stage;
a supporting stage mounted to the frame; and
a vibration-attenuation device situated between the wafer stage and the supporting stage, the vibration-attenuation device comprising a bellows defining an interior volume configured to be pressurized with a fluid, the bellows being situated along a respective support axis of the wafer stage and positioned between the wafer stage and the supporting stage, wherein the interior volume of the bellows is pressurized to an internal fluid pressure substantially equal to a zero-stiffness pressure such that the bellows exhibits a substantially zero lateral stiffness.

78. The apparatus of claim 77, wherein the interior volume of the bellows is pressurized to an internal fluid pressure greater than the zero-stiffness pressure.

79. The apparatus of claim 77, wherein the interior volume of the bellows is pressurized to an internal fluid pressure less than the zero-stiffness pressure.

80. The apparatus of claim 77, wherein the interior volume of the bellows is connected to a fluid source configured to supply the internal fluid pressure to the bellows.

81. The apparatus of claim 80, wherein the vibration-attenuation device further comprises:
a pressure sensor in fluid communication with the interior volume of the bellows and configured for producing pressure data corresponding to the internal pressure of the bellows; and
a pressure regulator fluidly connected to the bellows and to the fluid source, the pressure regulator being configured to adjust the pressure, supplied by the fluid source to the interior volume, in response to the pressure data.

82. The apparatus of claim 81, wherein the vibration-attenuation device further comprises a controller connected to the pressure sensor and to the pressure regulator, the controller being configured to change the internal fluid pressure in the bellows in response to the pressure data.

83. The apparatus of claim 80, wherein the vibration-attenuation device further comprises:
a pressure sensor in fluid communication with the interior volume of the bellows and configured for producing pressure data corresponding to the internal pressure of the bellows; and
a controller connected to the pressure sensor and configured for changing an amount of fluid delivered by the fluid source to the interior volume in response to the pressure data.

84. The apparatus of claim 80, wherein the vibration-attenuation device further comprises a controller situated and configured for changing an amount of fluid delivered by the fluid source to the interior volume so as to establish the internal fluid pressure.

85. The apparatus of claim 84, wherein the wafer stage has a variable center of gravity, the vibration-attenuation device further comprising a center-of-gravity sensor connected to the controller and configured to detect changes in the center of gravity of the wafer stage, the controller being further configured to change the internal fluid pressure in the bellows in response to the changes in the center of gravity.

86. The device of claim 85, wherein the center-of-gravity sensor comprises at least one laser interferometer.

87. The apparatus of claim 77, wherein the bellows provides a primary support force along the support axis, the vibration-attenuation device further comprising at least one active support situated relative to the bellows on a respective secondary support axis and configured to provide a secondary support force to the wafer stage along the secondary support axis.

88. The apparatus of claim 87, wherein the vibration-attenuation device comprises multiple bellows situated between the supporting stage and the wafer stage, each bellows having associated therewith a respective active support.

89. The apparatus of claim 87, wherein the vibration-attenuation device comprises bellows extending between respective locations on the supporting stage and the wafer stage, and at least three active supports, wherein each bellows has associated therewith a respective active support.

90. The apparatus of claim 87, wherein the active support is configured to move the wafer stage in at least one degree of freedom relative to the supporting stage.

91. The apparatus of claim 87, wherein the active support is configured to move the wafer stage in three degrees of freedom relative to the supporting stage.

92. The apparatus of claim 87, wherein the active support is further configured to measure the secondary support force applied by the active support.

93. The apparatus of claim 92, further comprising a controller connected to the active support and configured to change the secondary support force, in response to the measured secondary support force, to a predetermined value of the secondary support force.

94. The apparatus of claim 93, wherein the controller is further configured to control the secondary support force to maintain the internal fluid pressure of the bellows at the pressure substantially equal to the zero-stiffness pressure such that the bellows maintains a substantially zero lateral stiffness accompanying changes in the secondary support force.

95. The apparatus of claim 92, wherein:
the wafer stage has a variable center of gravity; and
the vibration-attenuation device further comprises a center-of-gravity sensor situated and configured to detect changes in the center of gravity of the wafer stage.

96. The apparatus of claim 95, wherein:
the vibration-attenuation device further comprises a controller connected to the center-of-gravity sensor; and
the controller is configured to change the secondary support force in response to changes in the center of gravity of the wafer stage.

97. The apparatus of claim 96, wherein:
the wafer stage is supported in a plane; and
the controller changes the secondary support force of the active support so as to maintain the wafer stage in the plane.

98. The apparatus of claim 95, wherein the center-of-gravity sensor comprises at least one laser interferometer.

99. The apparatus of claim 87, wherein the active support comprises an air mount.

100. The apparatus of claim 99, wherein:
the bellows providing the primary support force is a primary bellows; and
the air mount comprises a secondary bellows having an interior volume less than the interior volume of the primary bellows.

101. The apparatus of claim 99, wherein the air mount comprises a respective compliant chamber.

102. The apparatus of claim 87, wherein the active support comprises an electromagnetic actuator configured to generate the secondary support force.

103. The apparatus of claim 102, wherein the electromagnetic actuator comprises a voice coil motor, a variable reluctance actuator, or an EI-core.

104. An object manufactured using the apparatus of claim 77.

105. A method for attenuating vibration between a first mass and a second mass, comprising:
extending a bellows having an interior volume configured to be pressurized with a fluid between the first and second mass such that the second mass is supported, at least partially, by the bellows;
pressurizing the interior volume to a pressure substantially equal to a zero-stiffness pressure such that the bellows exhibits a substantially zero lateral stiffness.

106. The method of claim 105, wherein the pressure substantially equal to a zero-stiffness pressure is greater than the zero-stiffness pressure.

107. The method of claim 105, wherein the pressure substantially equal to a zero-stiffness pressure is less than the zero-stiffness pressure.

108. The method of claim 105, wherein the bellows provides a primary support force along the support axis, the method further comprising placing at least one active support between the first and second mass on a secondary support axis relative to the bellows, the active support being configured to provide a secondary support force to at least one of the masses along the secondary support axis.

109. The method of claim 108, wherein the second mass has a variable center of gravity, the method further comprising:
providing a center-of-gravity sensor situated and configured to detect changes in the center of gravity of the second mass;
providing a controller connected to the center-of-gravity sensor, the controller being configured to change the secondary support force in response to changes in the center of gravity of the second mass.

110. The method of claim 105 wherein the second mass is supported in a plane, the method further comprising providing a controller that is configured to change the secondary support force of the active support so as to maintain the second mass in the plane.

111. An object manufactured by the method of claim 105.

* * * * *

UNITED STATES PATENT AND TRADEMARK OFFICE
CERTIFICATE OF CORRECTION

PATENT NO. : 6,870,600 B2 Page 1 of 1
DATED : March 22, 2005
INVENTOR(S) : Andrew J. Hazelton It is certified that error appears in the above-identified patent and that said Letters Patent is hereby corrected as shown below:

Title page,
Item [56], References Cited, U.S. PATENT DOCUMENTS, add -- U.S. Appl. No. 09/663,184, filed Sep. 15, 2000, Yuan et al., --.

Column 5,
Line 18, "(y)" should be -- ($y$) --.
Line 31, "(y):" should be -- ($y$): --.

Column 6,
Line 17, "F=p$_{bellAbell}$" should be -- $F=p_{bell}A_{bell}$ --.

Column 14,
Line 51, "AE" should be -- $A_E$ --.

Column 15,
Lines 8 and 63, "AE" should be -- $A_E$ --.

Signed and Sealed this

Eleventh Day of April, 2006

JON W. DUDAS
*Director of the United States Patent and Trademark Office*